US012805226B2

(12) United States Patent
Barlaz et al.

(10) Patent No.: US 12,805,226 B2
(45) Date of Patent: Nov. 17, 2026

(54) METHOD FOR LATERAL ETCH WITH BOTTOM PROTECTION

(71) Applicant: Tokyo Electron Limited, Tokyo (JP)

(72) Inventors: David Eitan Barlaz, Albany, NY (US); Adam Pranda, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 134 days.

(21) Appl. No.: 18/959,050

(22) Filed: Nov. 25, 2024

(65) Prior Publication Data

US 2026/0150600 A1 May 28, 2026

(51) Int. Cl.

| | |
|---|---|
| ***H10P 50/24*** | (2026.01) |
| ***G01N 21/21*** | (2006.01) |
| ***H01J 37/32*** | (2006.01) |
| ***H10P 14/60*** | (2026.01) |
| ***H10P 50/28*** | (2026.01) |

(52) U.S. Cl.

CPC .......... *H10P 50/242* (2026.01); *G01N 21/211* (2013.01); *H01J 37/32091* (2013.01); *H01J 37/321* (2013.01); *H10P 14/6336* (2026.01); *H10P 50/283* (2026.01); *H01J 2237/3322* (2013.01); *H01J 2237/3346* (2013.01)

(58) Field of Classification Search

None

See application file for complete search history.

(56) References Cited

U.S. PATENT DOCUMENTS

| | | | |
|---|---|---|---|
| 4,938,996 A | 7/1990 | Ziv et al. | |
| 5,877,045 A | 3/1999 | Kapoor | |
| 9,171,733 B2 | 10/2015 | Ruzic et al. | |
| 9,543,148 B1 * | 1/2017 | Hudson | H01J 37/32091 |
| 10,147,655 B2 | 12/2018 | deVilliers | |
| 10,510,550 B2 | 12/2019 | Peck et al. | |
| 10,998,244 B2 | 5/2021 | deVilliers | |
| 11,302,588 B2 | 4/2022 | Clark et al. | |
| 2005/0078462 A1 | 4/2005 | Dando et al. | |

(Continued)

FOREIGN PATENT DOCUMENTS

| | | |
|---|---|---|
| CN | 112746245 A | 5/2021 |
| DE | 102012214925 B3 | 10/2013 |

(Continued)

OTHER PUBLICATIONS

International Searching Authority, "Notification of Transmittal of the International Search Report and the Written Opinion of the International Searching Authority, or the Declaration," PCT/US2024/018336, Mailed: Jun. 28, 2024, Total p. 10.

(Continued)

*Primary Examiner* — Shamim Ahmed

(74) *Attorney, Agent, or Firm* — Slater Matsil, LLP

(57) ABSTRACT

A method includes forming a first layer over a substrate, patterning the first layer to form a plurality of recesses therein, forming a second layer on a top surface of the first layer and on sidewalls and bottoms of the recesses, selectively forming a protection layer on the bottoms of the recesses. Selectively forming the protection layer includes heating bottoms of the recesses with polarized light and depositing a material of the protection layer on the bottoms of the recesses. The method further includes performing a lateral etch process to reduce a thickness of the second layer at the sidewalls of the recesses.

20 Claims, 11 Drawing Sheets

(56) References Cited

U.S. PATENT DOCUMENTS

| | | | | |
|---|---|---|---|---|
| 2018/0286643 | A1 | 10/2018 | Tuitje | |
| 2019/0198338 | A1 | 6/2019 | Kim | |
| 2019/0198467 | A1 | 6/2019 | Tanaka et al. | |
| 2021/0183656 | A1 | 6/2021 | Lee | |
| 2022/0068645 | A1* | 3/2022 | Katsunuma ....... | H01J 37/32834 |
| 2022/0190229 | A1 | 6/2022 | Wojtecki | |
| 2022/0293419 | A1 | 9/2022 | Lu | |
| 2024/0379354 | A1* | 11/2024 | Barlaz ............... | H01J 37/32339 |

FOREIGN PATENT DOCUMENTS

| | | | |
|---|---|---|---|
| EP | 0470784 | A2 | 2/1992 |
| JP | 2871712 | B2 | 3/1999 |
| JP | 2003328140 | A | 11/2003 |
| KR | 102287787 | B1 | 8/2021 |

OTHER PUBLICATIONS

Peck, J. et al., “Mechanism behind dry etching of Si assisted by pulsed visible laser,” Journal of Applied Physics, vol. 122, No. 17, Nov. 2017, 8 pages, American Institute of Physics.

Peck, J. et al., “Sub-damage-threshold plasma etching and profile tailoring of Si through laser-stimulated thermal desorption,” Journal of Vacuum Science Technology, vol. 36, No. 2, Mar./Apr. 2018, 8 pages, American Vacuum Society.

* cited by examiner

METHOD FOR LATERAL ETCH WITH BOTTOM PROTECTION

TECHNICAL FIELD

The present disclosure relates generally to methods of processing a substrate, and, in particular embodiments, to a method for lateral etch with bottom protection.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices is performed using plasma processes.

The semiconductor industry has repeatedly reduced the minimum feature sizes in semiconductor devices to a few nanometers to increase the packing density of components. Accordingly, the semiconductor industry increasingly demands plasma-processing technology to provide processes for patterning features with accuracy, precision, and profile control, often at atomic scale dimensions. These requirements are particularly stringent for three-dimensional (3D) structures, for example, a fin field-effect transistor (FinFET) wherein the gate electrode wraps around three sides of closely-spaced, narrow and long fin-shaped semiconductor features formed by etching trenches into the semiconductor substrate. Meeting this challenge along with the uniformity and repeatability needed for high volume IC manufacturing requires further innovations of plasma processing technology.

SUMMARY

In accordance with an embodiment, a method includes forming a first layer over a substrate, patterning the first layer to form a plurality of recesses therein, forming a second layer on a top surface of the first layer and on sidewalls and bottoms of the recesses, selectively forming a protection layer on the bottoms of the recesses. Selectively forming the protection layer includes heating bottoms of the recesses with polarized light and depositing a material of the protection layer on the bottoms of the recesses. The method further includes performing a lateral etch process to reduce a thickness of the second layer at the sidewalls of the recesses.

In accordance with another embodiment, a method includes introducing a substrate into a processing chamber, the substrate including a plurality of recesses and a dielectric layer lining bottoms and sidewalls of the recesses, and while the substrate is in the processing chamber, performing an area selective deposition process to form a protection layer on the dielectric layer at the bottoms of the recesses. Performing the area selective deposition process includes exposing the substrate to polarized light, the polarized light heating the dielectric layer at the bottoms of the recesses, and performing a deposition process on the substrate to form a material of the protection layer over the dielectric layer at the bottoms of the recesses. A width of the recesses is less than half a wavelength of the polarized light. The method further includes performing a lateral etch process on the substrate to reduce a thickness of the dielectric layer at the sidewalls of the recesses.

In accordance with yet another embodiment, a method includes placing a substrate on a holder within a plasma processing chamber, the substrate including a plurality of recesses and a dielectric layer lining bottoms and sidewalls of the recesses. The method further includes, while the substrate is on the holder, performing an area selective deposition process to form a protection layer on the dielectric layer at the bottoms of the recesses. Performing the area selective deposition process includes exposing the substrate to polarized light, the polarized light heating the dielectric layer at the bottoms of the recesses, and performing a plasma-assisted deposition process on the substrate to form a material of the protection layer on the dielectric layer at the bottoms of the recesses. The method further includes performing a plasma-assisted lateral etch process on the substrate to reduce a thickness of the dielectric layer at the sidewalls of the recesses. The protection layer covers the dielectric layer at the bottoms of the recesses while performing the plasma-assisted lateral etch process.

BRIEF DESCRIPTION OF THE DRAWINGS

For a more complete understanding of the present disclosure, and the advantages thereof, reference is now made to the following descriptions taken in conjunction with the accompanying drawings, in which.

Figure 1A:
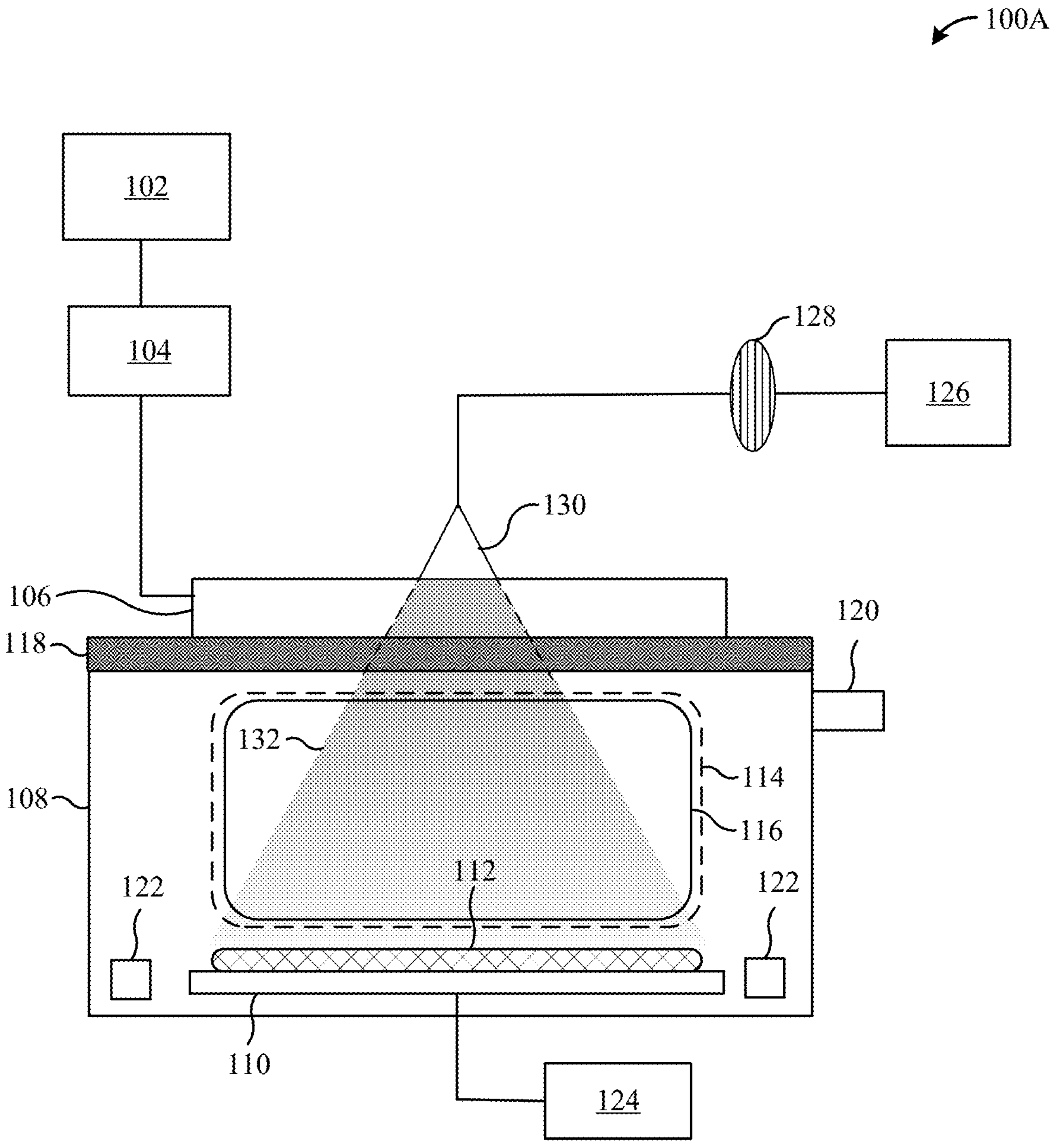
FIG. 1A illustrates a diagram of a plasma processing system, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

The present disclosure relates to methods of processing a substrate, more particularly to a method for lateral etch with selective bottom protection. Generally, fabricating complicated structures for advanced semiconductor devices, for example 3D devices such as gate-all-around field effect transistors (GAAFETs), may require laterally removing materials to selectively expose a portion of the underlying structure. However, it is challenging to make lateral etching sufficiently selective because vertical etching may not be completely eliminated from the etching process. In certain cases, a poor directional selectivity of lateral etching may adversely cause damages to the device structure at the bottom.

Embodiments of the present application disclose methods of plasma process comprising selective bottom protection and lateral etching. In this disclosure, bottom protection refers to a layer deposition or formation over a bottom portion of a feature (e.g., recesses, trenches or vias), which may then protect an underlying layer during the lateral etch. In various embodiments, the selective bottom protection may be achieved by an area selective deposition (ASD) process, which allows for selective deposition on different areas (e.g., surfaces) of a feature.

The ASD process includes using polarized light to differentially heat different areas of features while performing a deposition process. The deposition process may be a plasma-free or a plasma-assisted deposition process. Differential heating of bottom surfaces of features (e.g., recesses, trenches or vias) with polarized light may improve reaction rates of an ASD precursor deposition process at feature bottoms. Patterns with regularly spaced features may be differentially heated with linearly polarized light using an orientation and wavelength that allows linearly polarized light to reach respective bottoms of the features. Patterns with irregular or isolated features (e.g., curved waveguides) may have light preferentially delivered to bottoms of features using grazing incidence or circular polarization. Various process parameters (e.g., light polarization and wavelength, plasma conditions, etc.) may be adjusted to optimize the selective bottom protection, particularly its thickness and the directionality of layer formation. The directionality of layer formation (e.g., selectivity of deposition at the bottom relative to the sidewalls) allows for achieving the lateral etching selective to the bottom surface.

In various embodiments, the lateral etch process may be an isotropic etch process such as an isotropic wet etch process and an isotropic dry etch process. The isotropic dry etch process may be a plasma-free or a plasma-assisted etch process. In other embodiments, the lateral etch process may be an anisotropic etch process having a lateral etch rate greater than a vertical etch rate. The methods of lateral etch with selective bottom protection described herein may be applied to various semiconductor device fabrication processes, for example, as a sidewall spacer etch back in a GAAFETs fabrication process.

Embodiments of the present disclosure are described in the context of the accompanying drawings. Embodiments of plasma processing systems are described referring to FIGS. 1A-1D. Embodiments of a fabrication process comprising a lateral etch with selective bottom protection is described referring to FIGS. 2A, 2B, 3A, 3B, 4A, 4B, 5A, and 5B. An example application of a method for a lateral etch with selective bottom protection in GAAFETs fabrication is described referring to FIGS. 6A and 6B. An embodiment of a method for lateral etch with selective bottom protection is described referring to FIG. 7. An embodiment of a method for an area selective deposition (ASD) process is described referring to FIG. 8.

FIG. 1A illustrates a diagram of a plasma processing system 100A that operates using inductively coupled plasma (ICP), in accordance with some embodiments. Plasma processing system 100A includes an RF source 102, a matching circuit 104, an antenna 106, a plasma processing chamber 108, a polarized laser system including a laser generator 126, a polarizing filter 128, and a beam expander 130, and, optionally, a dielectric plate 118, which may (or may not) be arranged as illustrated in FIG. 1A. Further, plasma processing system 100A may include additional components not depicted in FIG. 1A.

In various embodiments, antenna 106 is coupled to RF source 102 through matching circuit 104. RF source 102 includes an RF power supply, which may include a generator circuit. RF source 102 provides forward RF waves to antenna 106, which are radiated towards plasma processing chamber 108. Throughout the description, the RF source 102 may be alternatively referred to as a power supply or RF source. RF source 102 is coupled to matching circuit 104 and matching circuit 104 is coupled to antenna 106 via power transmission lines, such as coaxial cables or the like. RF source 102 may be configured to provide RF power to antenna 106 as a continuous wave (CW). In various embodiments, RF source 102 may be configured to provide pulse-modulated RF power to antenna 106.

Typically, a matching circuit (auto or manual) coupled to a radiating antenna is used to minimize losses (i.e., reflected power) in response to changes in the load condition. Matching circuit 104 (also referred to as a matching network or an impedance matching network) is coupled between RF source 102 and antenna 106. As forward power propagates from RF source 102 to antenna 106, some reflected power may be reflected back due to impedance mismatch between the plasma processing chamber 108 and RF source 102. Matching circuit 104 is used to reduce reflected power by transforming the impedance looking into matching circuit 104 (in other words, the impedance of the transmission lines, plasma process chamber 108, and antenna 106) to a same impedance as RF source 102 and any intermediate transmission lines. This increases the efficiency of supplying power to plasma processing chamber 108.

Plasma processing chamber 108 may be, e.g., a medium frequency (MF) or high frequency (HF) plasma chamber. Plasma processing chamber 108 may be a vacuum chamber. In some embodiments, plasma processing chamber 108 is configured to operate plasma 116 at a first resonant frequency, wherein the first resonant frequency is in a range from about 1 MHz to about 27 MHz. For example, the plasma processing chamber 108 may be configured to operate plasma 116 at 1 MHz or more, 13.56 MHz or more, 27 MHz or more, or the like. However, any suitable plasma processing chamber 108 may be used and may generate plasma with any suitable method, such as DC plasma.

In various embodiments, plasma processing chamber 108 includes a substrate holder 110 (e.g., a chuck). Substrate holder 110 may be a vacuum chuck, an electrostatic chuck, a mechanical chuck, or the like. As illustrated, substrate 112 (e.g., a semiconductor wafer) is placed on substrate holder 110 to be processed. In some embodiments, plasma processing chamber 108 may include a bias power supply 124 coupled to substrate holder 110.

Plasma processing chamber 108 may include one or more inlets 120 to introduce a process gas or a process gas mixture into plasma processing chamber 108. In the illustrated embodiment, inlet 120 is coupled to a sidewall of the plasma processing chamber 108. In other embodiments, inlet 120 may be coupled to a top or bottom of plasma processing chamber 108. Plasma processing chamber 108 may also include one or more pump outlets 122 to remove by-products from plasma processing chamber 108 through selective control of gas flow rates within. In various embodiments, pump outlets 122 are placed near (e.g., below/around the perimeter of) substrate holder 110 and substrate 112. In various embodiments, plasma processing chamber 108 may include additional substrate holders (not illustrated). In various embodiments, the placement of the substrate holder 110 may differ from that illustrated in FIG. 1A. Thus, the quantity and position of the substrate holder 110 are non-limiting.

In various embodiments, antenna 106 is inductively coupled to plasma processing chamber 108 and radiates an electromagnetic field toward plasma processing chamber 108. In an embodiment, antenna 106 includes arms connected to capacitive structures that generate the azimuthal symmetry. In various embodiments, the excitation frequency of antenna 106 is in the radio frequency range (10-400 MHz), which is not limiting, and other frequency ranges can similarly be contemplated. For example, inventive aspects disclosed herein equally apply to applications in the microwave frequency range. Various examples of designs for antennas 106 may be found in U.S. patent application Ser. No. 17/649,823, which is incorporated by reference herein in its entirety. However, any suitable antenna 106 may be used.

In various embodiments, antenna 106 is outside of plasma processing chamber 108 and is separated from plasma processing chamber 108 by dielectric plate 118, which is typically made of a dielectric material. Dielectric plate 118 separates the low-pressure environment within plasma processing chamber 108 from the external atmosphere. It should be appreciated that antenna 106 can be placed directly adjacent to dielectric plate 118. In various embodiments, antenna 106 is separated from plasma processing chamber 108 by air. In various embodiments, the properties of dielectric plate 118 are selected to minimize reflections of the RF wave from plasma processing chamber 108. In other embodiments, antenna 106 is embedded within dielectric plate 118. In various embodiments, dielectric plate 118 is in the shape of a disk. Dielectric plate 118 may be transparent or semitransparent to light, such as laser light produced by the laser generator 126. Dielectric plate 118 includes a first outer surface and a second outer surface. The first outer surface faces the plasma processing chamber 108 and the second outer surface faces the antenna 106. The second outer surface is above the first outer surface in a vertical direction.

In an embodiment, the antenna 106 couples RF power from RF source 102 to the plasma processing chamber 108 to treat substrate 112. In particular, antenna 106 radiates an electromagnetic wave in response to being fed the forward RF waves from RF source 102. The radiated electromagnetic wave penetrates from the atmospheric side (i.e., antenna 106 side) of dielectric plate 118 into plasma processing chamber 108. The radiated electromagnetic wave generates an electromagnetic field within the plasma processing chamber 108. The generated electromagnetic field ignites the process gas or process gas mixture and sustains plasma 116 in a plasma generating region 114 by transferring energy to free electrons within plasma processing chamber 108.

In various embodiments, plasma generating region 114 is immediately below the nearest portion of dielectric plate 118 to plasma processing chamber 108. In various embodiments, the uppermost surface of plasma generating region 114 corresponds to the plane where the outer surface of dielectric plate 118 faces the plasma processing chamber 108. In the illustrated embodiment, antenna 106 is external to plasma processing chamber 108. In various embodiments, however, antenna 106 can be placed internal to the plasma processing chamber 108. In such an embodiment, plasma generating region 114 is immediately below the nearest portion of the antenna 106 to plasma processing chamber 108.

Generated plasma 116 can be used for a plasma process to, for example, selectively etch or deposit material on substrate 112. The plasma process may include an etch process such as a Reactive Ion Etch (RIE) process, an Atomic Layer Etch (ALE) process or the like, a deposition process such as a Plasma-Enhanced Physical Vapor Deposition (PVD) process, a Plasma-Enhanced Chemical Vapor Deposition (CVD) process, an Atomic Layer Deposition (ALD) process, an Area Selective Deposition (ASD) process, a combination thereof, or the like.

In the illustrated embodiment, plasma 116 is generated within plasma processing chamber 108. In such embodiments, plasma processing system 100A may be referred to as an in-situ plasma processing system. In other embodiments, plasma 116 may be generated in a plasma generation chamber that is different from the plasma processing chamber 108 and introduced into the plasma processing chamber 108 from plasma generation chamber. In such embodiments, antenna 106 may comprise an inductive coil that is wrapped around plasma generation chamber and plasma processing system 100A may be referred to as a remote plasma processing system.

In various embodiments, plasma processing system 100A includes a polarized laser system for treating the substrate 112 in order to improve selectivity for an area selective deposition (ASD) process performed on the substrate 112. The polarized laser system includes laser generator 126, polarizing filter 128, and beam expander 130. In various embodiments, laser generator 126 is a pulsed laser with, e.g., a pulse energy delivered to substrate 112 in a range from 3 $mJ/cm^2$/pulse to 1000 3 $mJ/cm^2$/pulse and a wavelength in a range from 170 nm to 3000 nm. Laser generator 126 may be configured to produce laser pulses with a duration of 20 femtoseconds to 100 milliseconds. The wavelength of laser generator 126 may be greater than widths of features (e.g., recesses) on the substrate 112. In some embodiments, the wavelength of laser generator 126 may be 2 times the width of the features (e.g., recesses) on the substrate 112.

Laser light from laser generator 126 passes through polarizing filter 128 and through beam expander 130 into the plasma processing chamber 108 to target the substrate 112. Laser light may be guided through polarizing filter 128 and beam expander 130 by, e.g., an optical fiber or the like. In various embodiments, polarizing filter 128 is a linear filter to produce linearly polarized laser light. In other embodiments, polarizing filter 128 is a circular filter to produce circularly polarized light. Beam expander 130 widens polarized light 132 in order to target a large portion of the substrate 112, or multiple substrates 112. In some embodiments, beam expander 130 comprises one or more lenses. However, any suitable beam expander or focusing lens may be used.

Figure 1B:
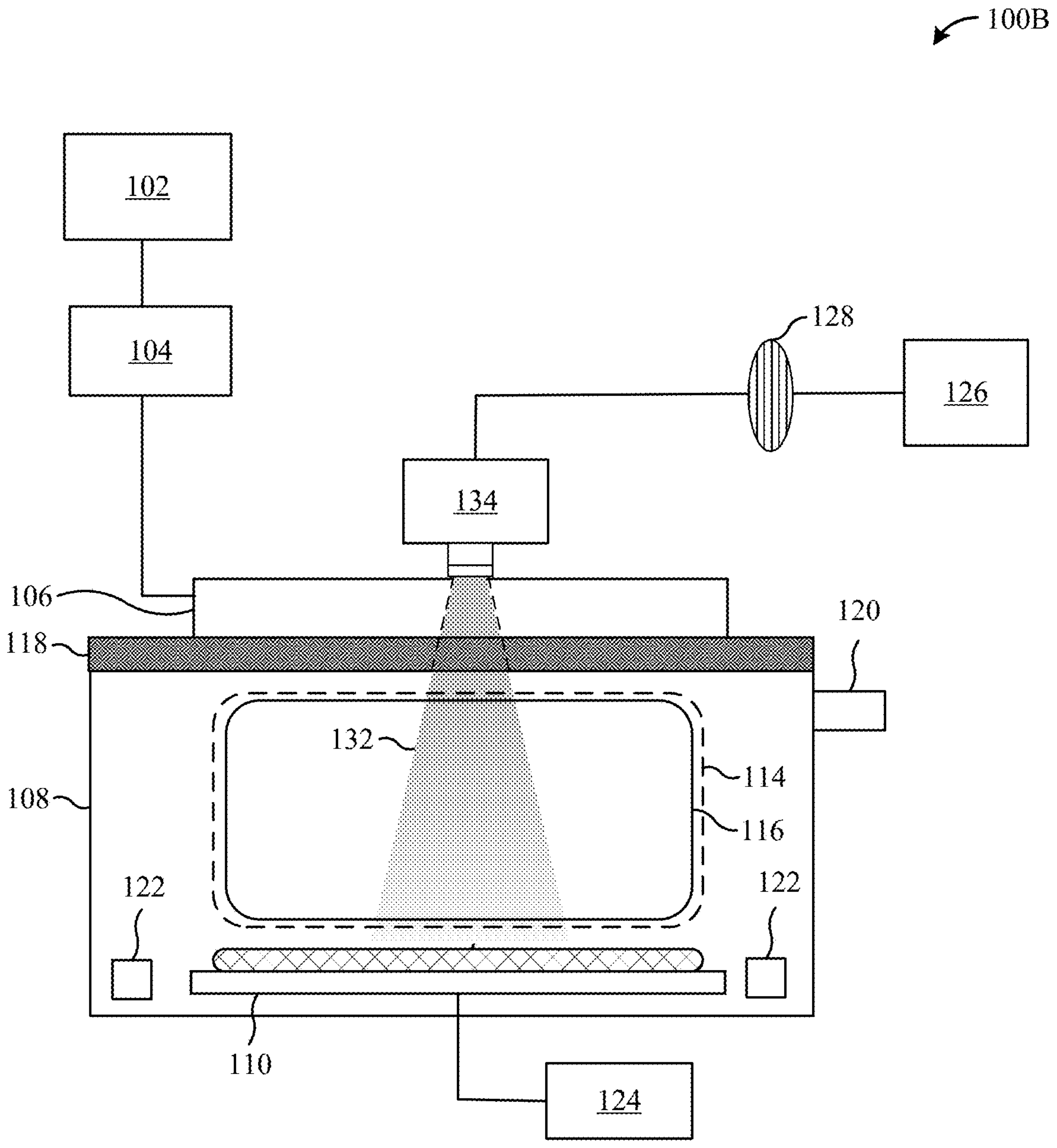
FIG. 1B illustrates a diagram of another plasma processing system, in accordance with some embodiments.

In some embodiments, as illustrated by FIG. 1B, plasma processing system 100B comprises a beam expander that is or includes a digital light projection system 134 (also referred to as a digital projection system) as described in U.S. Pat. No. 10,147,655, which is hereby included by reference herein in its entirety. Additionally, digital light projection system 134 may include mirrors with built-in polarizing gratings, so that the function of the polarizing filter 128 may also be performed by digital light projection system 134 and polarizing filter 128 external to digital light projection system 134 may be omitted. As such, digital light projection system 134 projects polarized light 132 into the plasma processing chamber 108. In some embodiments, digital light projection system 134 illuminates specific spots on substrate 112 as controlled by a program of digital light projection system 134. For example, if more material is being etched in a center portion of substrate 112, digital light projection system 134 may illuminate only the center portion of substrate 112, or may illuminate the center portion of substrate 112 longer than an edge portion of substrate 112. However, digital light projection system 134 may illuminate any suitable portion of substrate 112 for any suitable length of time.

Referring again to FIG. 1A, polarized light 132 from the beam expander 130 passes through antenna 106 and dielectric plate 118 (if present). In some embodiments, beam expander 130 may be aimed through a gap in antenna 106 (e.g., a space between spiral arms of antenna 106). Dielectric plate 118, if present, may be transparent to the polarized light 132. Plasma processing chamber 108 may have one or more openings or transparent windows (also referred to as view ports) adjacent to beam expander 130 to allow polarized light 132 to enter plasma processing chamber 108. One or more window(s) added to the body of plasma processing chamber 108 may be used to enable an ASD process if multiple light sources are in range of the window(s) or if the multiple light sources are swapped into and out of position (e.g., on a turret or a linear stage).

In some embodiments, polarized light 132 penetrates plasma 116 in plasma generating region 114 to reach substrate 112. In such embodiments, plasma 116 is transparent to the polarized light 132. In other embodiments, pulses of polarized light 132 are synchronized to be out of phase with the pulsed power of RF source 102 in order to allow for better transmission through plasma processing chamber 108 to substrate 112.

Polarized light 132 may differentially deposit thermal energy on bottom surfaces of features (e.g., recesses) on substrate 112 rather than on sidewalls or top surfaces of features on substrate 112. In other words, polarized light 132 enables preferential heating of, e.g., recess bottoms. This heating of bottom surfaces of features with the polarized light 132 may improve precursor reaction rates of an ASD deposition process. The energy of laser generator 126 may be tuned over a range from less than 1 $mJ/cm^2$/pulse to an ablation threshold of 400-600 $mJ/cm^2$/pulse, depending on the type of material of the features, other plasma conditions, or the like. Additionally, precursor adhesion and/or desorption of undesirable contaminants and reaction byproducts on bottom surfaces of features may be altered by polarized light 132 as a function of temperature. As pulse heating from pulsed polarized light 132 may dissipate rapidly, the preferential heating by polarized light exposure may be useful for short features. In some embodiments, the preferential heating by polarized light exposure is not dependent on precursor chemical or substrate material and may be used with any suitable ASD precursor or substrate material.

Preferentially delivering thermal energy to the bottoms of the features may allow for desirable adhesion of precursors and/or desorption of undesirable contaminants and reaction byproducts as well as tuning of reaction rate kinetics without causing undesirable ablation of material on substrate 112. Improved selectivity of deposition enabled by polarized light exposure may improve on existing chemical selectivity of ASD processes, such as for high aspect ratio features. This may desirably increase reaction rates and lead to higher process throughput.

In embodiments in which the polarized light 132 is linearly polarized, the linearly polarized light may have an orientation and wavelength that allows light to reach bottoms of regularly spaced features (e.g., recesses, trenches or vias). For example, laser wavelength may be chosen to be smaller than recess widths and a polarization plane of the linearly polarized light maybe chosen as a plane (e.g., YZ plane in FIGS. 2A and 2B) that is parallel to and extends along recesses. The linear polarization of the polarized light 132 thereby allows thermal energy to be deposited on bottom surfaces of features (e.g., recesses) while avoiding top surfaces of features that are oriented 90 degrees out of phase with the plane of linear polarization. Targeting of feature bottoms does not depend on depths of features (e.g., recesses) but on pitches between the features. As such, the polarized light 132 may be used with features with high aspect ratio (e.g., deep recesses), low aspect ratio (e.g., shallow recesses), or a combination thereof (e.g., staircase style structures or etches).

In some embodiments, the plasma processing system 100B may be configured for location-specific processing (LSP) when different locations of the substrate 112 are subject to different treatments. For example, an edge of the substrate 112 may be subjected to a different treatment than a center of the substrate 112. In some embodiments, LSP may be combined with the ADS process to perform a location-specific ADS process.

Figure 1C:
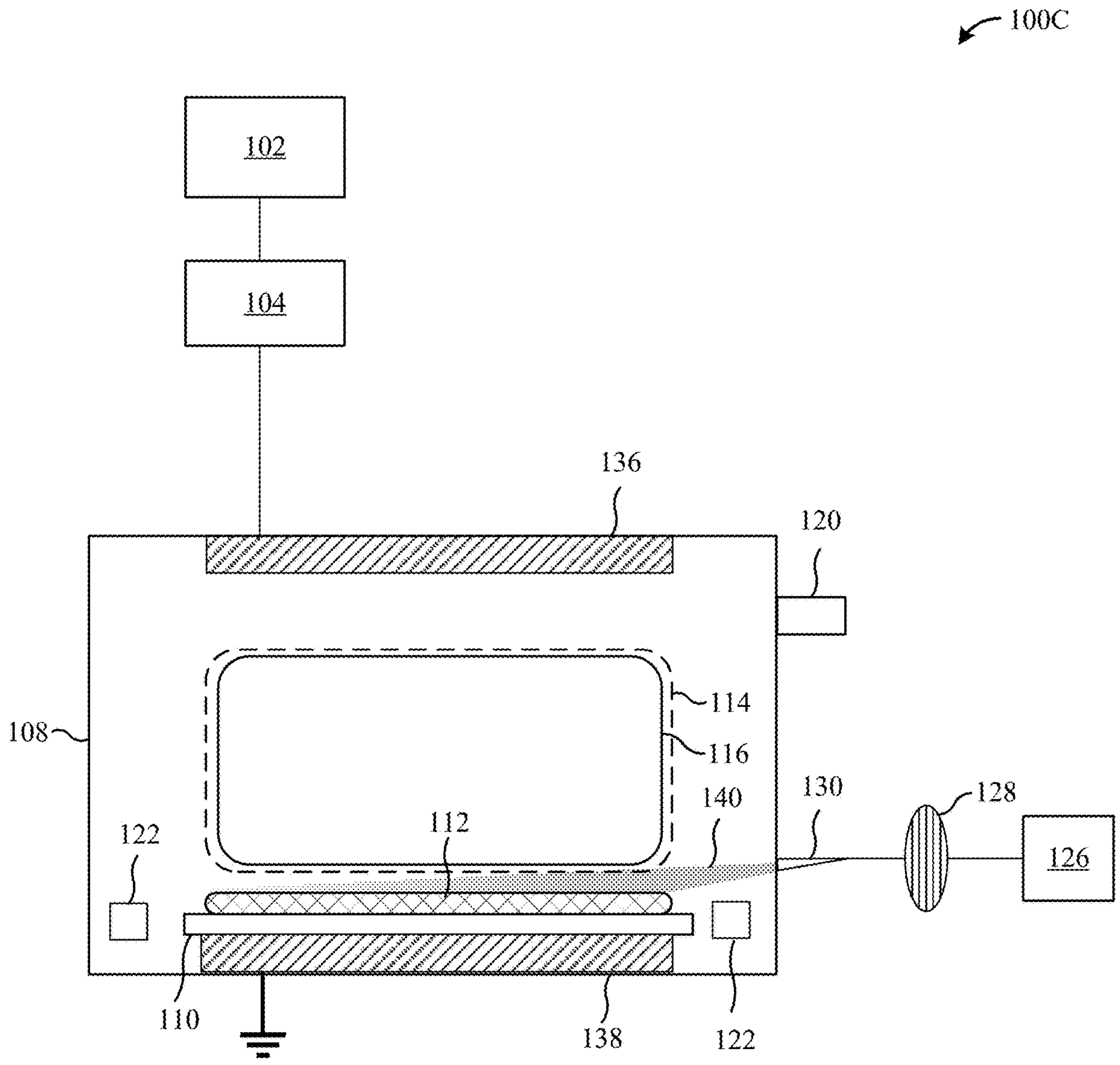
FIG. 1C illustrates a diagram of another plasma processing system, in accordance with some embodiments.
Figure 2A:
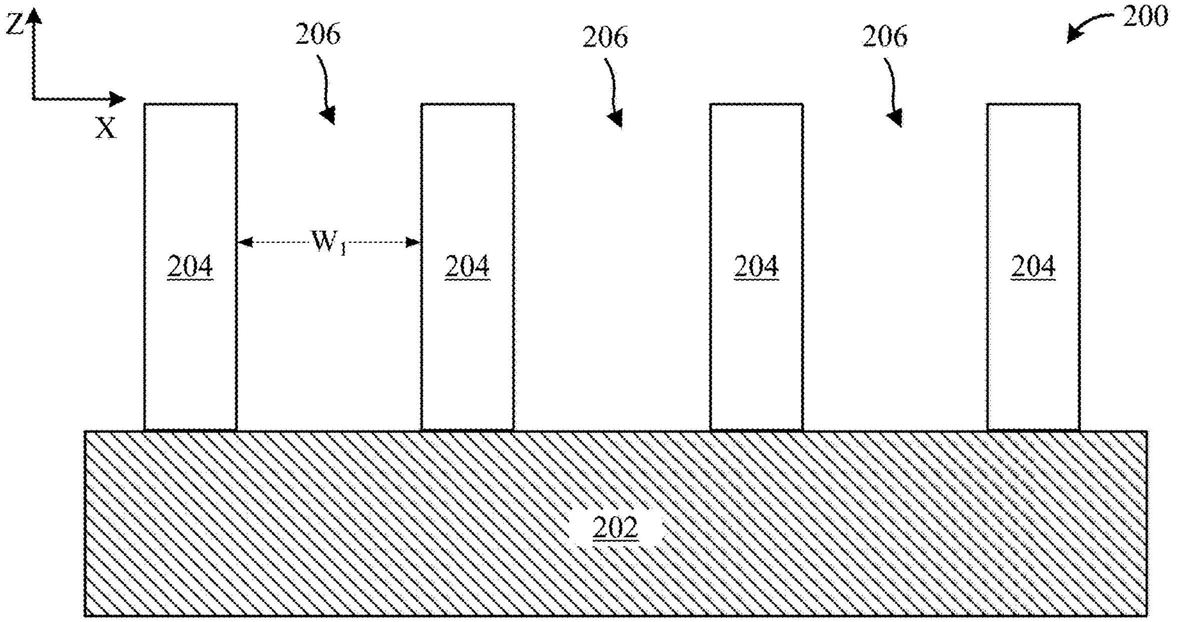
FIGS. 2A, 2B, 3A, 3B, 4A, 4B, 5A, and 5B illustrate various cross-sectional and top views of intermediate steps of a fabrication process comprising a lateral etch with selective bottom protection, in accordance with some embodiments.

FIG. 1C illustrates a diagram of an embodiment plasma processing system 100C that operates using capacitively coupled plasma (CCP), in accordance with some embodiments. Plasma processing system 100C includes an RF source 102, a matching circuit 104, a first electrode 136, a second electrode 138, a plasma processing chamber 108, and a polarized laser system including a laser generator 126, a polarizing filter 128, and a beam expander 130, which may (or may not) be arranged as illustrated in FIG. 2A. Further, plasma processing system 100C may include additional components not depicted in FIG. 1C.

First electrode 136 is located in plasma processing chamber 108 above substrate holder 110 and is coupled to RF source 102, e.g., through matching circuit 104. Second electrode 138 is located in plasma processing chamber 108 below substrate holder 110. In some embodiments, second electrode 138 is coupled to ground. In other embodiments, second electrode 138 is coupled to another RF source, e.g., through another matching circuit. An electric field is generated between first electrode 136 and second electrode 138, which act as opposite plates of a capacitor. The electric field ignites and couples power to plasma 116 in a plasma generating region 114. Generated plasma 116 can be used for a plasma process such as, for example, an area selective deposition (ASD) process, or another plasma process as described above with respect to FIG. 1A.

As first electrode 136 may be located over the substrate holder 110 (and over a mounted substrate 112), in some embodiments, polarized laser system is positioned to project polarized light 140 through a sidewall of plasma processing chamber 108 rather than through a top of plasma processing chamber 108. Polarized light system includes beam expander 130 that is coupled to laser generator 126 through the polarizing filter 128 by, e.g., an optical fiber or the like.

Beam expander 130 may be positioned at an opening or transparent window into plasma processing chamber 108 above a top surface of substrate holder 110. As such, polarized light system may be included with any existing plasma chamber design that is compatible with an opening or transparent window in a suitable position. Beam expander 130 expands polarized light 140 in order to target a large portion of substrate 112, or multiple substrates 112. In some embodiments, beam expander 130 comprises one or more lenses. However, any suitable beam expander 130 may be used.

Figure 1D:
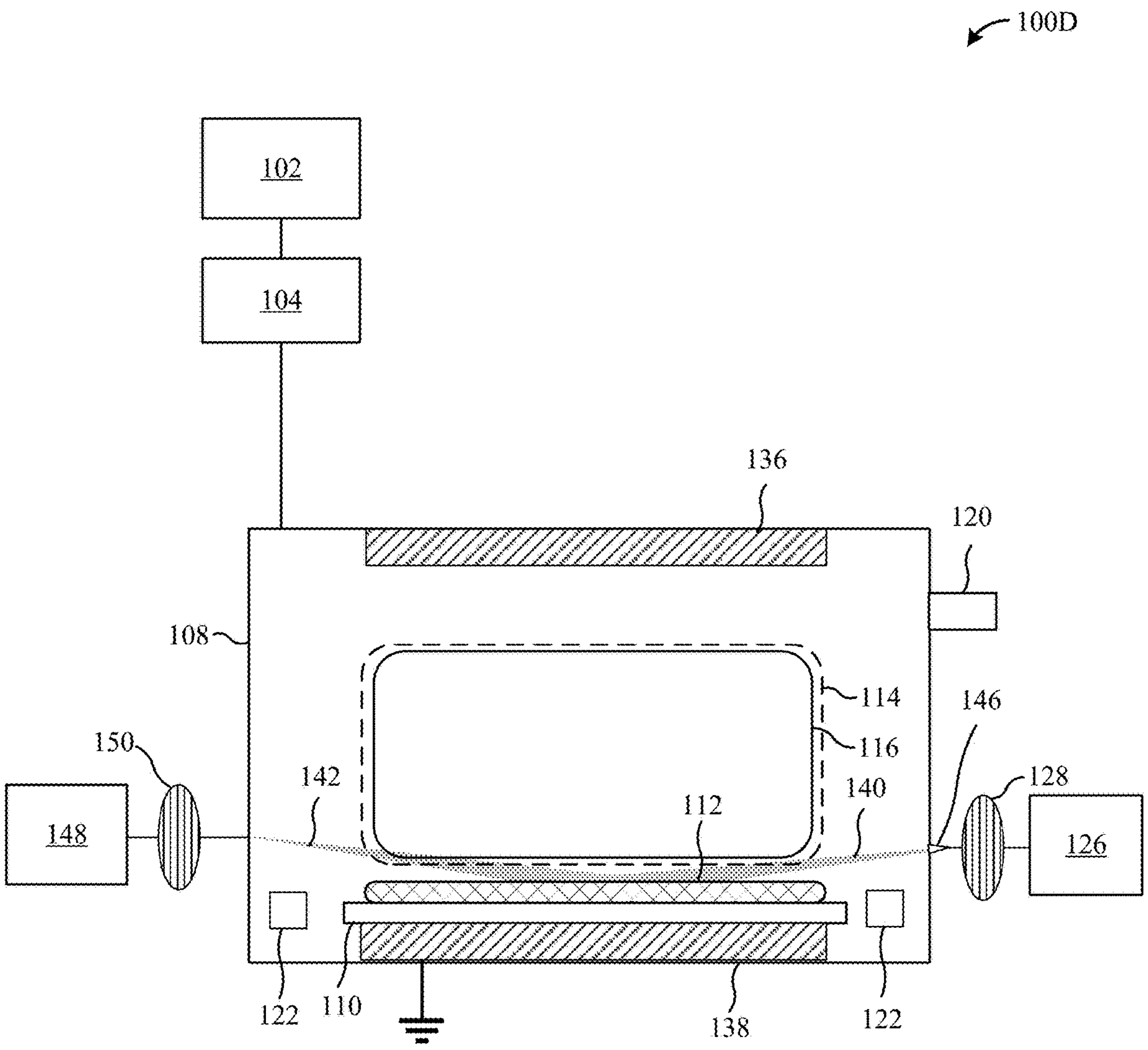
FIG. 1D illustrates a diagram of another plasma processing system, in accordance with some embodiments.

FIG. 1D illustrates a diagram of an embodiment plasma processing system 100D that includes an ellipsometer, in accordance with some embodiments. Plasma processing system 100D is similar to plasma processing system 100C (see above, FIG. 1C) and operates using capacitively coupled plasma (CCP) with polarized light 140 projected through a sidewall of plasma processing chamber 108.

Polarized laser system of plasma processing system 100D comprises an ellipsometer. Ellipsometer comprises a light source (e.g., laser generator 126), a polarizing filter 128, a beam focuser 146, and a detector 148 with associated optics such as an analyzer 150 (e.g., second polarizing filter) and an optional compensator (e.g., a quarter wave plate) between detector 148 and plasma processing chamber 108. Beam focuser 146 focuses polarized light 140 on a single spot of the substrate 112. In some embodiments, beam focuser 146 comprises one or more lenses. However, any suitable beam focuser 146 may be used. Polarized light 140 hits a single spot of the substrate 112, from which reflected polarized light 142 is received by detector 148 through analyzer 150. Detector 148 measures the change in the polarization of reflected polarized light 142 from the polarization of polarized light 140, which may be used to, for example, provide feedback on the physical properties of substrate 112. The vertical positions of laser generator 126 and detector 148 with respect to substrate 112 may be different from their illustration in FIG. 1D. For example, in some embodiments, laser generator 126 and detector 148 are above substrate 112 so that the incident angle of polarized light 140 and the reflected angle of reflected polarized light 142 are in a range of 40° to 70°. However, any suitable vertical positions of laser generator 126 and detector 148 may be used.

Embodiments in which polarized light 140 is linearly polarized may enable selectivity to the bottoms of features (e.g., recesses bottoms) on substrate 112. Substrate holder 110 may be rotated during exposure with polarized light 140 to increase uniformity of heating across substrate 112. Embodiments in which the polarized light 140 is circularly polarized may preferentially deliver light to bottoms of shallow, irregular, or isolated features (e.g., curved waveguides). In some embodiments, non-polarized light may be used at a grazing incidence to target bottoms of features on substrate 112. Rotating substrate holder 110 during polarized light bombardment and using circularly polarized light or non-polarized light at a grazing incidence may also be used in embodiments of ICP plasma processing systems 100A and 100B (see above, FIGS. 1A and 1B).

Although FIGS. 1A-1C illustrate embodiments of ICP plasma processing systems 100A and 100B having a polarized light system providing polarized light through a top surface of plasma processing chamber 108 and CCP plasma processing systems 100C and 100D having a polarized light system providing polarized light through a sidewall of plasma processing chamber 108, in other embodiments, ICP plasma processing systems 100A and 100B may have a polarized light system providing polarized light through a sidewall of the plasma processing chamber 108 and CCP plasma processing systems 100C and 100D may have a polarized light system providing polarized light through a top surface of plasma processing chamber 108. For example, an embodiment of the CCP plasma processing system 100C may have a beam expander 130 positioned at a top surface of plasma processing chamber 108 such that first electrode 136 does not block a path of polarized light 140 to substrate holder 110.

FIGS. 2A, 2B, 3A, 3B, 4A, 4B, 5A, and 5B illustrate various cross-sectional and top views of intermediate steps of a fabrication process comprising a lateral etch with selective bottom protection, in accordance with some embodiments. In particular, FIGS. 2A-5A illustrate cross-sectional views and FIGS. 2B-5B illustrate top views.

Figure 2B:
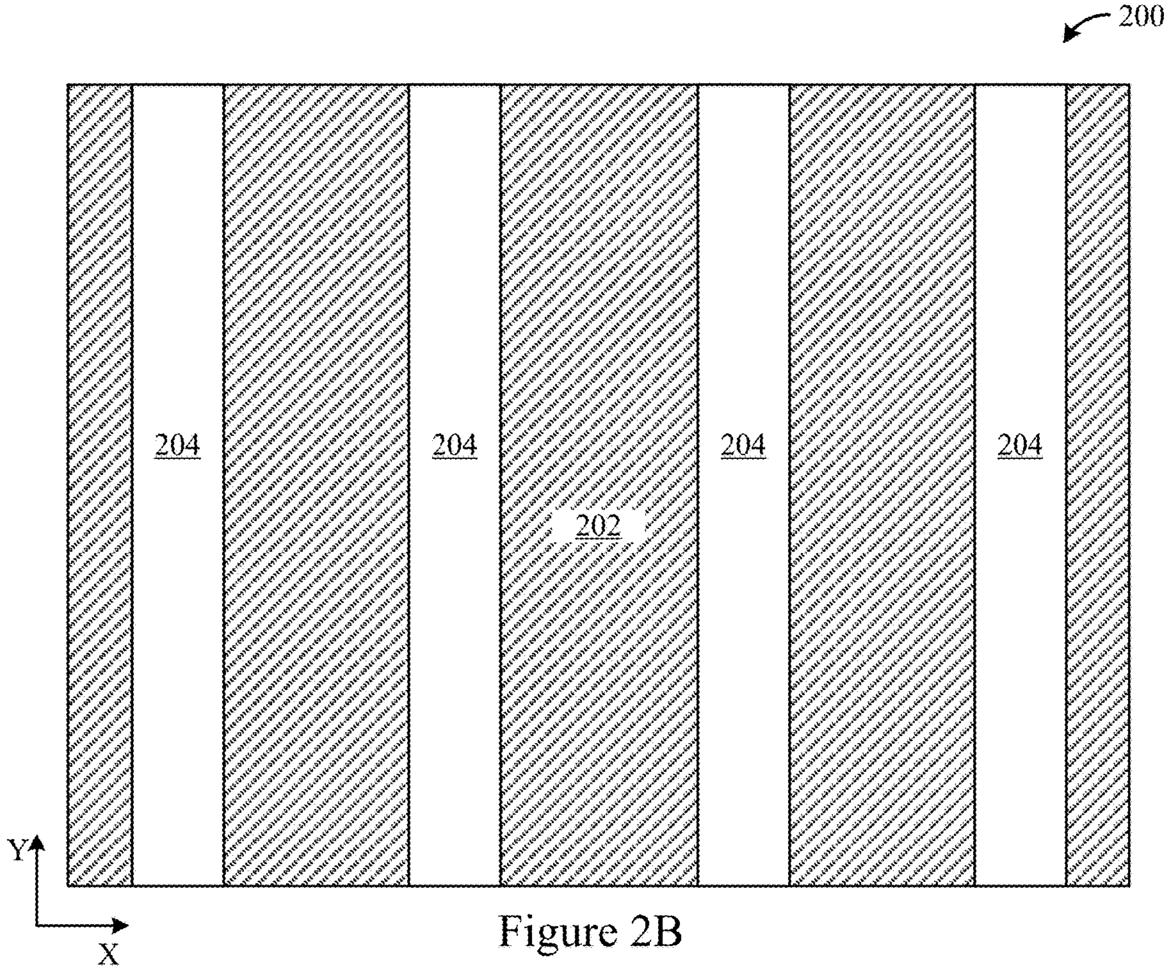

FIGS. 2A and 2B illustrate a semiconductor structure 200. Semiconductor structure 200 includes a substrate 202. In some embodiments, substrate 202 may be a silicon wafer, or a silicon-on-insulator (SOI) wafer. In certain embodiments, substrate 202 may comprise a silicon germanium wafer, silicon carbide wafer, gallium arsenide wafer, gallium nitride wafer, and other compound semiconductors. In other embodiments, substrate 202 comprises heterogeneous layers such as silicon germanium on silicon, gallium nitride on silicon, silicon carbon on silicon, as well layers of silicon on a silicon or SOI substrate. In various embodiments, substrate 202 is patterned or embedded in other components of the semiconductor device. In various embodiments, substrate 202 may be a part of a semiconductor device, and may have undergone a number of steps of processing following, for example, a conventional process. Substrate 202 accordingly may comprise layers of semiconductors useful in various microelectronics. For example, semiconductor structure 200 may comprise substrate 202 in which various device regions are formed.

In some embodiments, a material layer 204 may be formed over substrate 202. The material layer 204 may be patterned to have one or more recesses 206. Recesses 206 may expose a top surface of substrate 202. In some embodiments, the patterning process may include suitable photolithography and etch (e.g., reactive ion etch) processes. In certain embodiments, recesses 206 may comprise high aspect ratio (HAR) features having aspect ratio between 10:1 and 100:1. Recesses 206 may comprise a hole, trench, slit, or other suitable structures. In some embodiments, recesses 206 comprises a series of line recesses with a width $W_1$ between 5 nm and 200 nm. Recesses 206 may extend along a top surface of substrate 202. In the illustrated embodiment, recesses 206 extend along Y-direction.

In some embodiments, material layer 204 may comprise polysilicon or amorphous silicon. Further, material layer 204 may be a stack made of multiple layers. Material layer 204 may be deposited using an appropriate technique such as CVD, PVD, ALD, PECVD, a combination thereof, or the like. In one embodiment, material layer 204 has a thickness between 50 nm and 250 nm. In some embodiments, the deposition process may be performed by plasma processing system 100A, 100B, 100C, or 100D (see above, FIGS. 1A-1D).

Figure 3A:
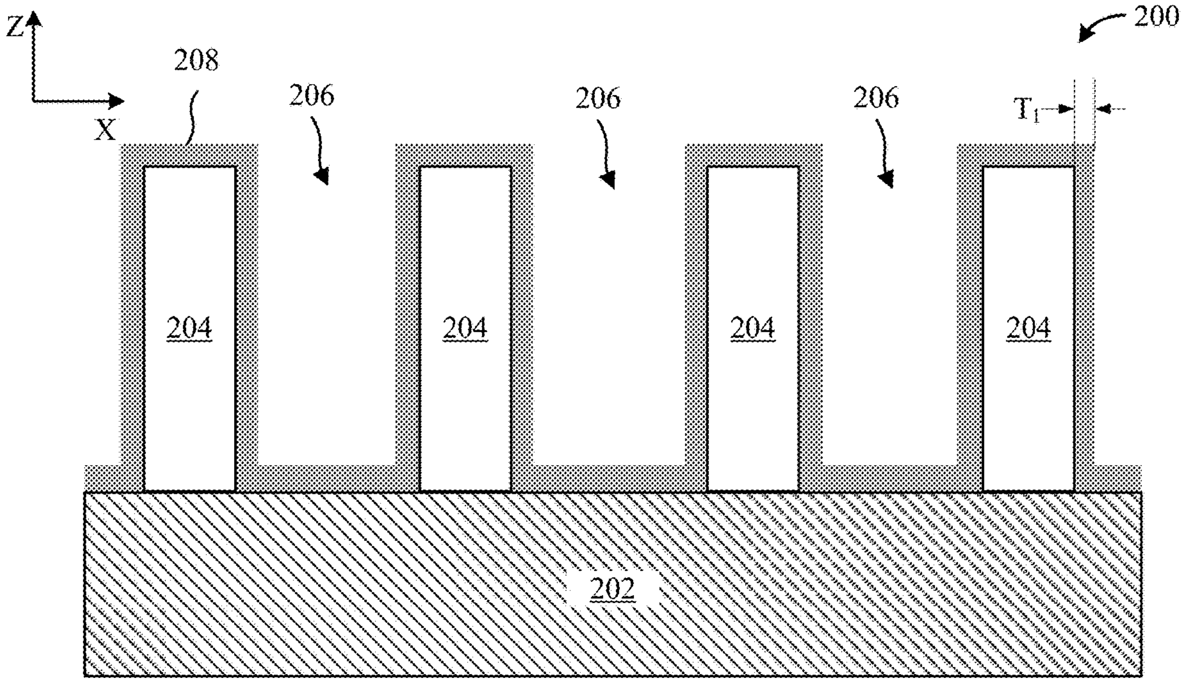
Figure 3B:
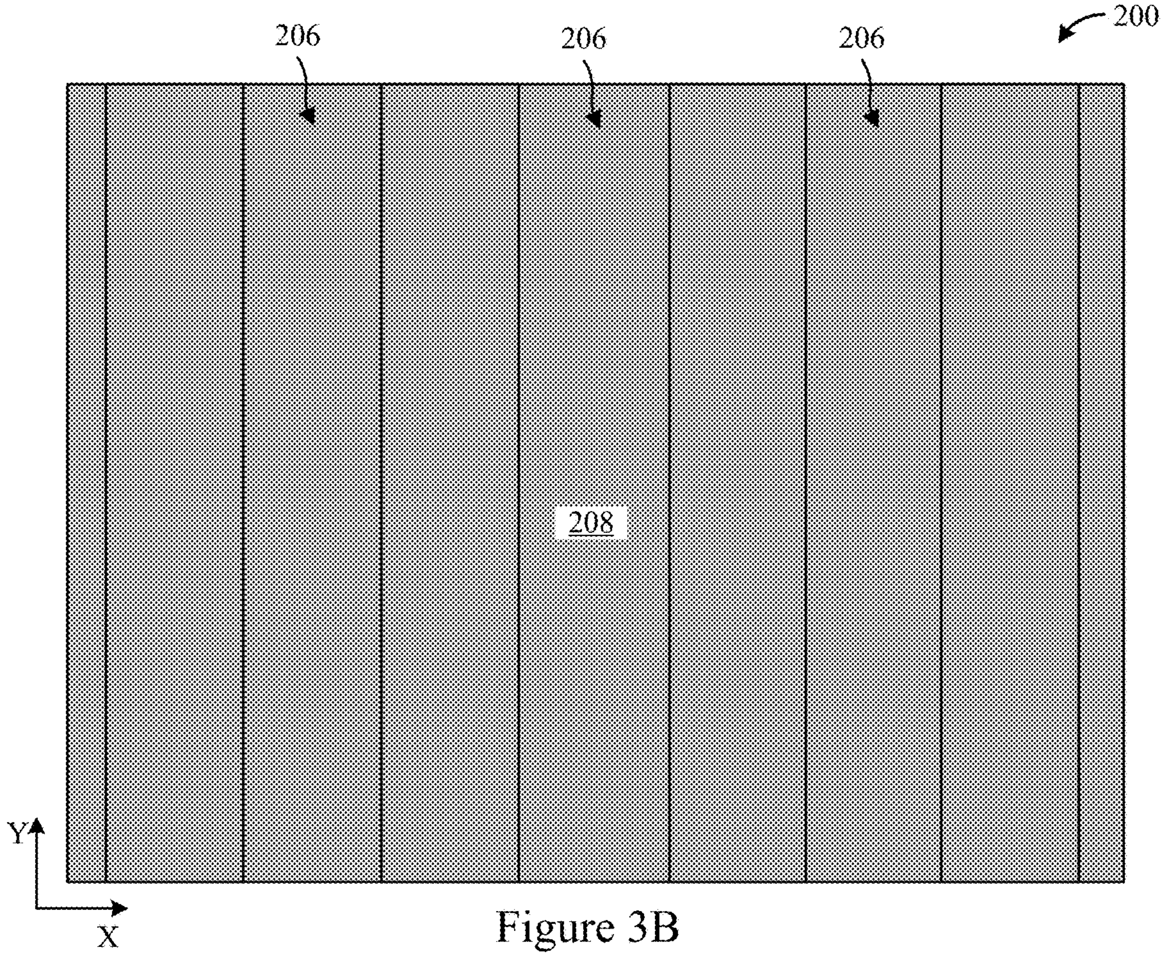

In FIGS. 3A and 3B, a dielectric layer 208 may be formed over material layer 204. In various embodiments, dielectric layer 208 may comprise silicon carbide (SiC), silicon oxycarbide (SiOC), silicon nitride (SiN), silicon oxynitride (SiON), a combination thereof, or the like. Dielectric layer 208 may be formed using a conformal deposition technique such as CVD, ALD, PECVD, a combination thereof, or the like. Accordingly, dielectric layer 208 may cover the top surface and sidewalls of the material layer 204 as well as the exposed surface of substrate 202 at the bottoms of recesses 206. In one embodiment, dielectric layer 208 has a thickness $T_1$ between 1 nm and 100 nm. In some embodiments, the deposition process may be performed by plasma processing system 100A, 100B, 100C, or 100D (see above, FIGS. 1A-1D).

Figure 4A:
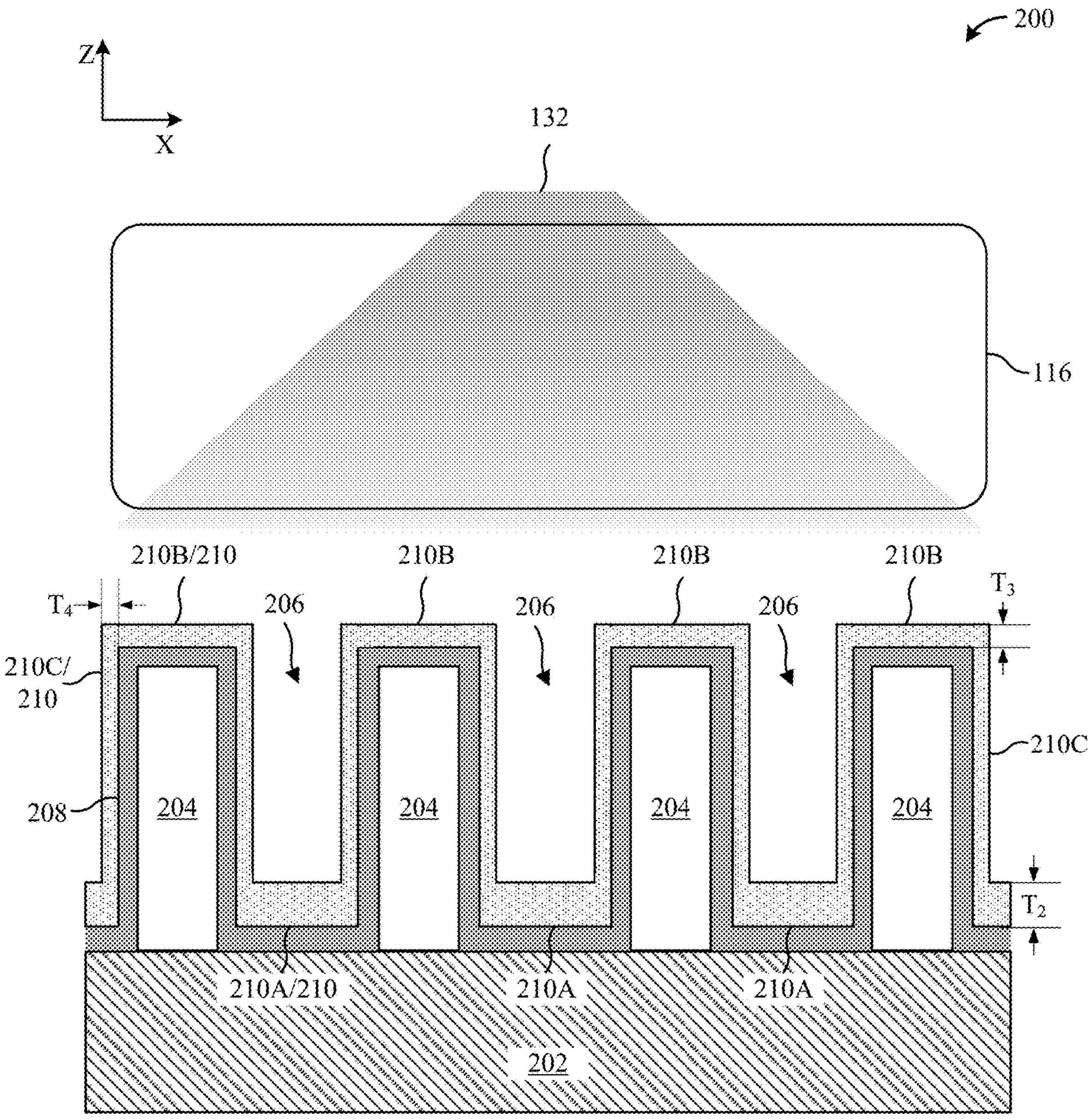
Figure 4B:
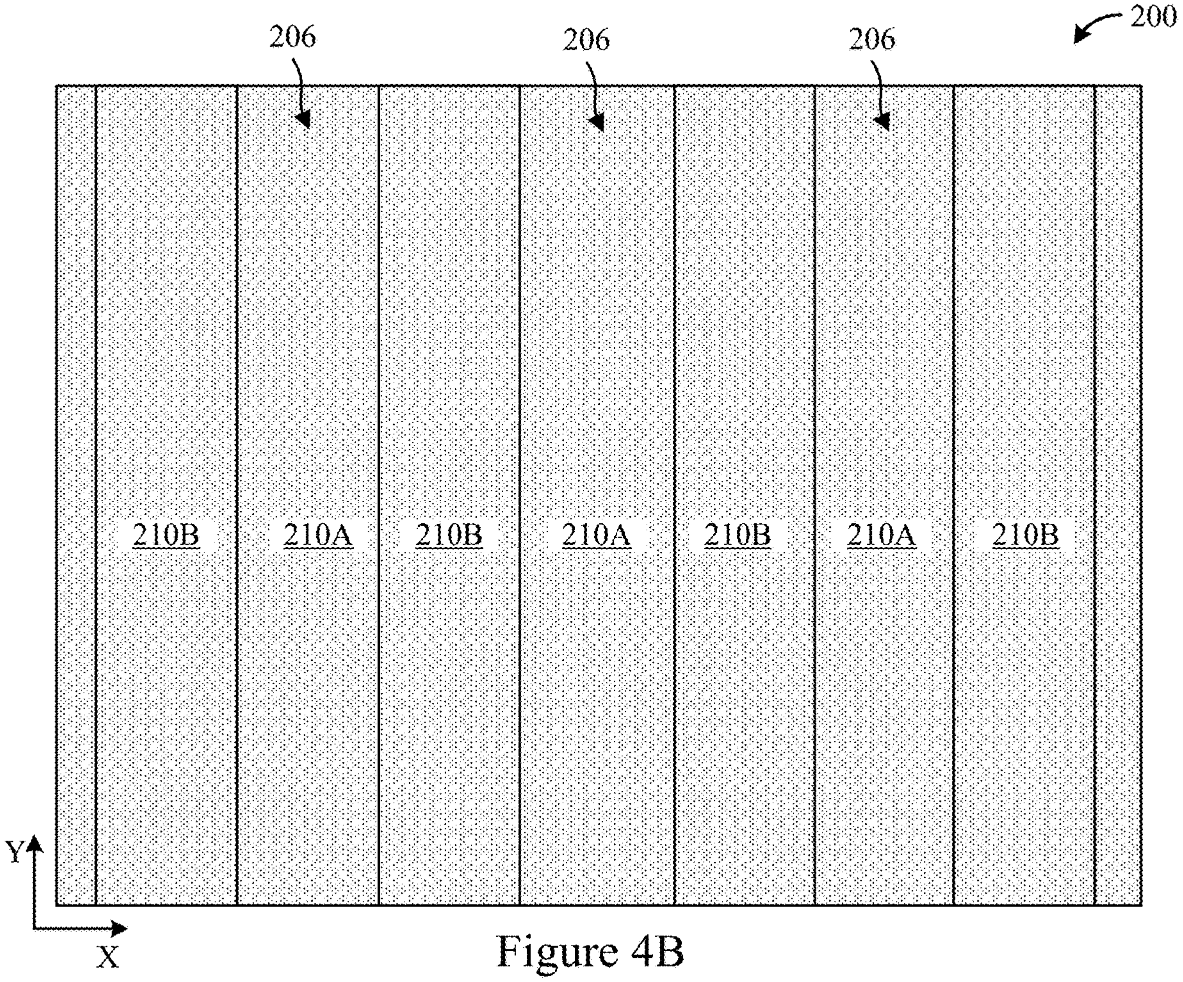

In FIGS. 4A and 4B, a material 210 is selectively deposited on the bottoms of recesses 206 to form a protection layer 210A. In some embodiments, the selective deposition process may also deposit a protection layer 210B on the top surface of the material layer 204 and a protection layer 210C on the sidewalls of the material layer 204, such that a thickness $T_3$ of the protection layer 210B and a thickness $T_4$ of the protection layer 210C are less than a thickness $T_2$ of the protection layer 210A. In one embodiment, the thickness $T_2$ is between 1 nm and 100 nm. In one embodiment, the thickness $T_3$ is between 0 nm and 100 nm. In one embodiment, the thickness $T_4$ is between 0 nm and 100 nm. In some embodiments, the thickness $T_3$ may be same as the thickness $T_4$. In other embodiments, the thickness $T_3$ may be different from the thickness $T_4$. In some embodiments, the thickness $T_2$ may be same as the thickness $T_3$. In other embodiments, the thickness $T_2$ may be different from the thickness $T_3$.

In some embodiments, the selective deposition process may be an ASD process. In such embodiments, after forming the dielectric layer 208, the semiconductor structure 200 is transferred to a plasma processing chamber (e.g., plasma processing chamber 108; see above, FIGS. 1A-1D) of a plasma processing system (e.g., plasma processing system 100A, 100B, 100C, or 100D; see above, FIGS. 1A-1D) to perform the ASD process. The ASD process may comprise a polarized light exposure process and a deposition process. The deposition process may be a plasma-free deposition process (e.g., CVD, ALD, or the like) or a plasma-assisted deposition process (e.g., PECVD, PEALD, or the like). In some embodiments, the polarized light exposure process and the deposition process are performed concurrently. In an embodiment in which the deposition process is a plasma-assisted deposition process, a wavelength of the polarized light 132 is chosen such that plasma 116 is transparent to polarized light 132. In another embodiment in which the deposition process is a plasma-assisted deposition process, pulses of polarized light 132 are synchronized to be out of phase with the pulsed power of RF source 102 (see above, FIG. 1A) in order to allow for better transmission through the plasma processing chamber (e.g., plasma processing chamber 108; see above, FIGS. 1A-1D) toward semiconductor structure 200.

In some embodiments, polarized light 132 preferentially heats the bottoms of recesses 206, such that a temperature of dielectric layer 208 at the bottoms of recesses 206 is higher than a temperature of dielectric layer 208 at the top surface of material layer 204. In some embodiments, polarized light 132 is linearly polarized with a wavelength larger than the width $W_1$ (see above, FIG. 2A) of recesses 206 and a polarization plane along YZ plane. However, any suitable linearly or circularly polarized light 132 or 140 may be used, as described above with respect to FIGS. 1A-1C.

The differential deposition of thermal energy into the bottoms of recesses 206 may improve a selectivity of the deposition process. In certain embodiments, material 210 may comprise an oxide, for example silicon oxide. In such embodiments, the deposition process may comprise a first plasma process exposing the semiconductor structure 200 to a first plasma comprising silicon. In certain embodiments, the first plasma may be generated from a first process gas comprising chlorosilane such as $SiCl_4$ and $SiH_3Cl$. In other embodiments, the first process gas may comprise a silane with a different halogen such as fluorosilane and bromosilane. In certain embodiments, the first process gas may further comprise other gases such as an inert gas (e.g., argon, nitrogen, or helium). In some embodiments, the first plasma process may be performed at a process pressure between 7 mTorr and 300 mTorr and a process temperature between −60° C. and 100° C. In other embodiments, the first plasma process may be performed at a process temperature greater than 100° C.

In some embodiments, the deposition process may further comprise a second plasma process exposing the semiconductor structure 200 to a second plasma comprising oxygen. In certain embodiments, the second plasma may be generated from a second process gas comprising molecular oxygen gas ($O_2$). In certain embodiments, the second process gas may further comprise other gases such as an inert gas (e.g., argon, nitrogen, or helium). In some embodiments, the second plasma process may be performed at a process pressure between 7 mTorr and 300 mTorr and a process temperature between −60° C. and 100° C. In other embodiments, the second plasma process may be performed at a process temperature greater than 100° C.

In one embodiment, silicon elements of material 210 may originate from silicon from the first process gas and also silicon from dielectric layer 208. In various embodiments, the chemical compositions of material 210 and the dielectric layer 208 may need to be sufficiently different to enable etch selectivity in a subsequent lateral etch process.

In various embodiments, material 210 may be selectively grown over the bottoms of recesses 206. In certain embodiments, some degree of material 210 formation, although thinner than on the bottoms of recesses 206, may also occur on the sidewalls of recesses 206 and the top surface of the material layer 204. As illustrated in FIGS. 4A and 4B, material 210 may cover the top surface of the material layer 204 (e.g., protection layer 210B), sidewalls of recesses 206 (e.g., protection layer 210C), and the bottoms of recesses 206 (e.g., protection layer 210A).

In various embodiments, various process parameters for the ASD process may be adjusted to achieve a desired anisotropy (directionality) for the formation of material 210. Accordingly, the sidewalls of recesses 206 may be free of material 210 formation during the ASD process, or the rate of material 210 formation on the sidewalls of recesses 206 may be minimized relative to the rate of material 210 formation over the horizontal surfaces. The anisotropic layer formation (horizontal versus vertical) may allow for proper bottom protection during a subsequent lateral etch process. In some embodiments, protection layer 210A at the bottoms of recesses 206 may be formed to be sufficiently thick to protect the underlying layer structure, while the protection layer at the sidewalls of recesses 206, if any, may be formed to be thin enough to be removed such that the lateral etch process can etch the underlying layer (e.g., dielectric layer 208 at the sidewalls of recesses 206).

Although this disclosure describes the directionality of layer formation with embodiments with two perpendicular surfaces (i.e., horizontal and vertical), in various embodiments, the methods may be applied to process a substrate with different features with non-perpendicular surfaces. The directionality of layer formation may therefore be extended to the formation of a protection layer with varying thickness that depends on surface angle, and thus potentially enabling a surface angle-dependent etch process.

Figure 5A:
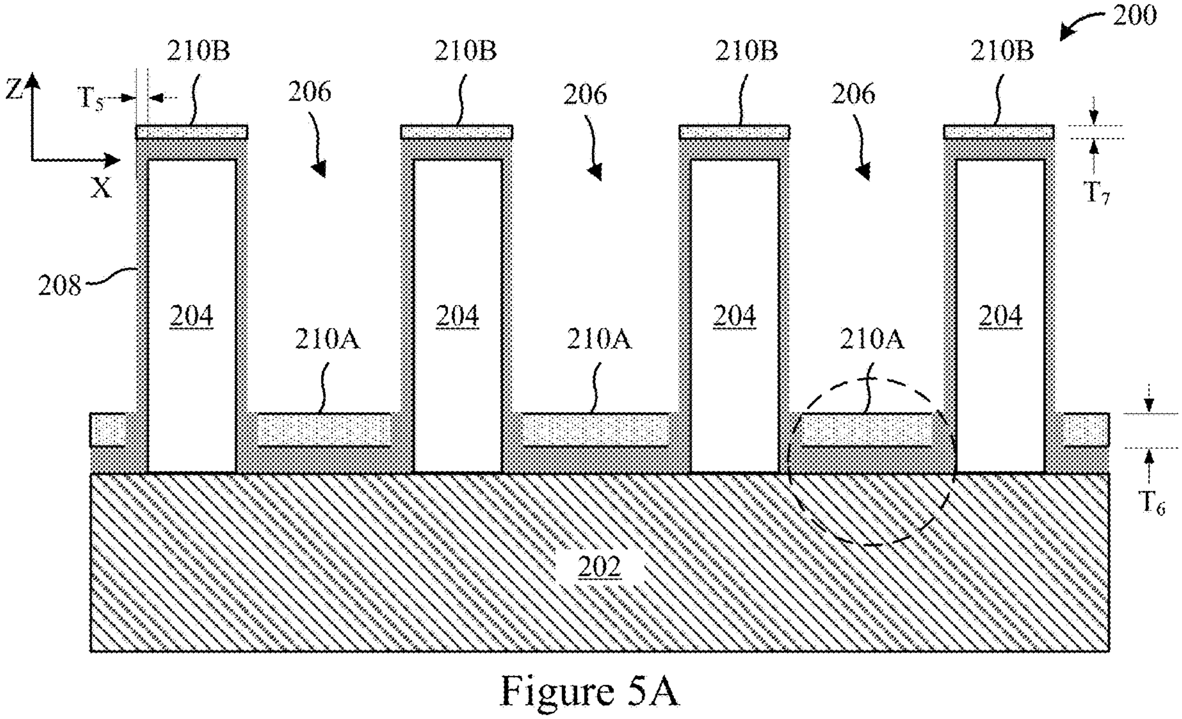
Figure 5B:
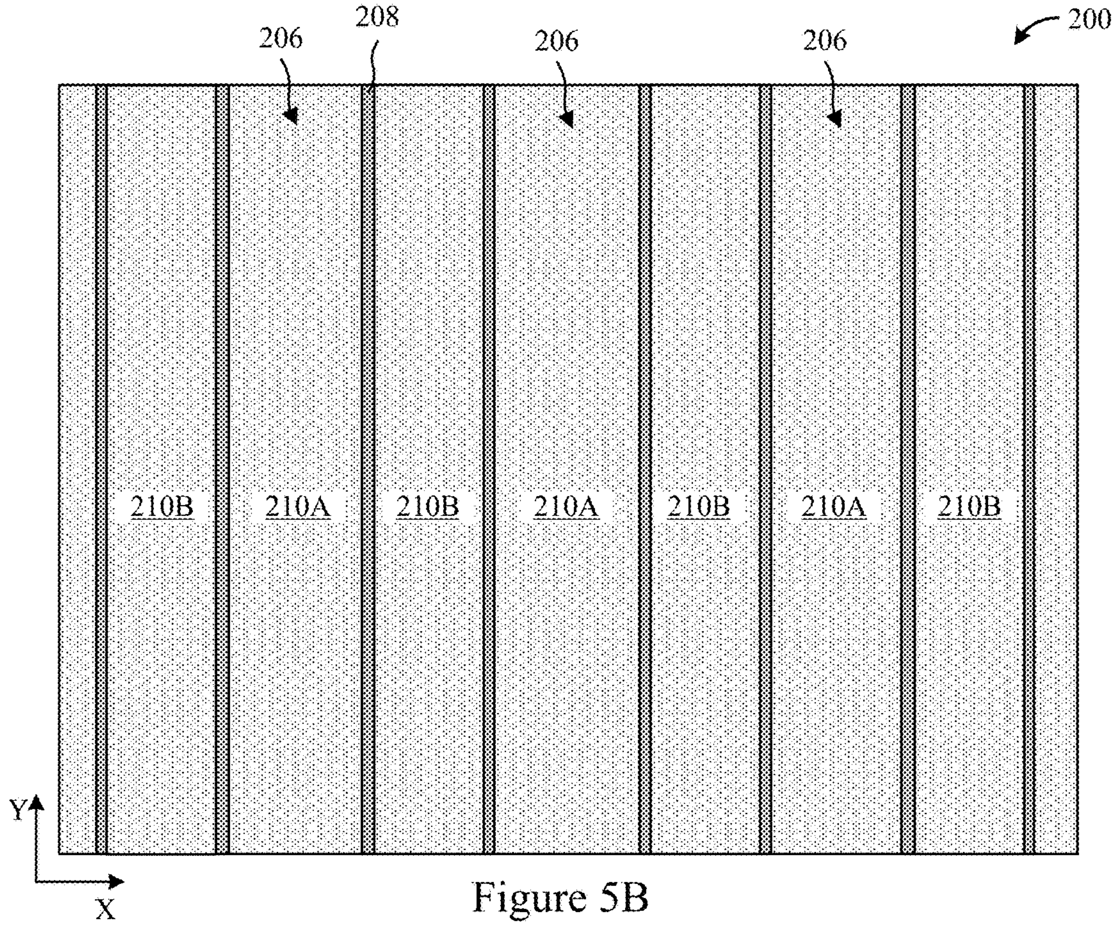

In FIGS. 5A and 5B, a lateral etch process is performed on semiconductor structure 200 to reduce a thickness of dielectric layer 208 at the sidewalls of recesses 206. In other words, the lateral etch process widens recesses 206. In various embodiments, the later etch process may comprise one or more wet etch processes, plasma etch processes, reactive ion etch (RIE) processes, combinations of these, or other etch processes. In certain embodiments in which the lateral etch process is a plasma etch process, semiconductor structure 200 remains in the plasma processing chamber (e.g., plasma processing chamber 108; see above, FIGS. 1A-1D) of the plasma processing system (e.g., plasma processing system 100A, 100B, 100C, or 100D; see above, FIGS. 1A-1D) and is exposed to a third plasma.

In some embodiments, the third plasma may be generated from a fluorine-containing gas. Examples of the fluorine-containing gas may include but are not limited to tetrafluoromethane ($CF_4$), nitrogen trifluoride ($NF_3$), fluoroform ($CHF_3$), difluoromethane ($CH_2F_2$), fluoromethane ($CH_3F$), combinations thereof, or the like. In certain embodiments, the etch gas further comprises molecular oxygen ($O_2$) at any ratio. In other embodiments, the etch gas may further comprise other oxygen-containing species such as O, CO, $O_3$, $H_2O$, a combination thereof, or the like. In one or more embodiments, the etch gas may comprise 0% to 50% by volume of oxygen. The etch gas may further comprise a diluent such as argon (Ar) and nitrogen ($N_2$) at any ratio. In certain embodiments, the etch gas may be chosen such that the lateral etch process etches dielectric layer 208 faster than the protection layer 210A.

The plasma condition may be adjusted to make the third plasma sufficiently isotropic such that the etching can occur at the sidewalls of recesses 206 and widen recesses 206. In various embodiments, the protection layer 210B formed by the ASD process protects dielectric layer 208 at the bottoms of recesses 206 from the third plasma, as indicated by a dashed circle in FIG. 5A.

In some embodiment in which the protection layer 210C (see FIG. 4A) is also present at the sidewalls of recesses 206, the protection layer 210C may be removed at the beginning of the lateral etch process and then the next layer (i.e., dielectric layer 208) may be etched laterally. In such embodiments, the etch chemistry may be selected to etch both of the two layers, which may cause some loss of protection layer 210A at the bottoms of recesses 206. Even so, since the protection layer 210A can be formed to be substantially thicker at the bottom than at the sidewalls, with a proper process control (e.g., isotropic etch conditions and process time), it is possible to enable the lateral etch of dielectric layer 208 without completely consuming protection layer 210A at the bottoms of recesses 206. In some embodiments, the lateral etch may partially or fully remove the protection layer 210B.

In certain embodiments, after performing the lateral etch process, dielectric layer 208 has a thickness $T_5$ at the sidewalls of recesses 206 that is less than the thickness $T_1$ (see above, FIG. 3A), protection layer 210A has a thickness $T_6$ that is less than the thickness $T_2$ (see above, FIG. 4A), and protection layer 210B has a thickness $T_7$ that is less than the thickness $T_3$ (see above, FIG. 4A).

In various embodiments, the lateral etch process may be halted to insert another cycle of selective protection layer formation to replenish the protection layer 210A at the bottoms of recesses 206. Similarly, to optimize the anisotropy of the lateral etch process, the protection layer formation (FIGS. 2A-4A and 2B-4B) and the lateral etch process (FIGS. 5A and 5B) may be cyclically repeated for any number of times.

In certain embodiments, after performing the lateral etch process, a portion of dielectric layer 208 may be still present, although thinned, over the sidewalls of recesses 206. This may be particularly useful when the lateral etch is used to only partially remove dielectric layer 208 and expose a feature initially embedded within dielectric layer 208 (not illustrated in FIGS. 2A-5A and 2B-5B). Such an example with the additional embedded feature is described below in a fabrication process for gate-all-around field effect transistors (GAAFETs) referring to FIGS. 6A and 6B. In other embodiments, although not specifically illustrated, the lateral etch process may be performed to completely remove dielectric layer 208 from the sidewalls of recesses 206.

Figure 6B:
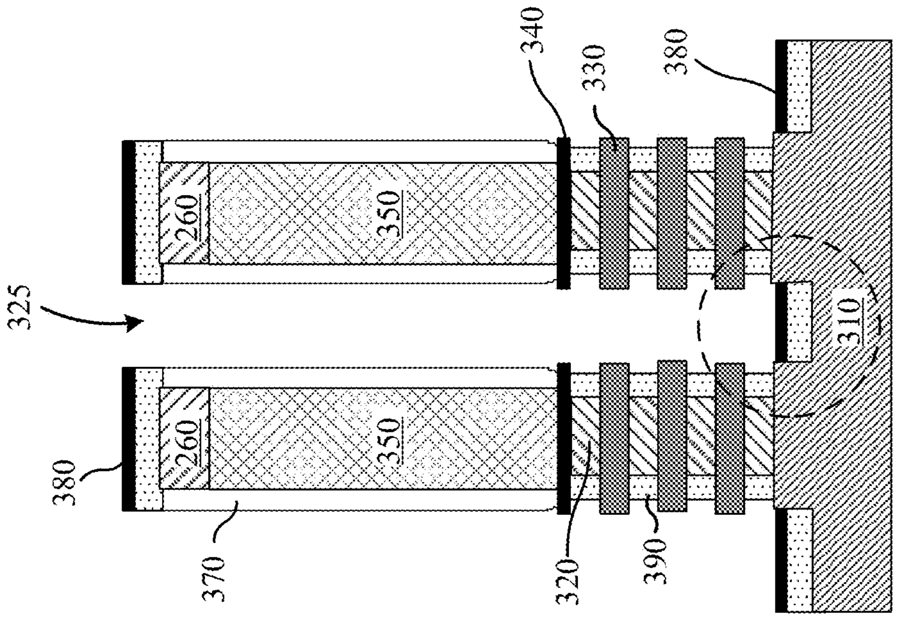
FIGS. 6A and 6B illustrate cross-sectional views of intermediate steps of fabricating gate-all-around field effect transistors (GAAFETs), in accordance with some embodiments.
Figure 6A:
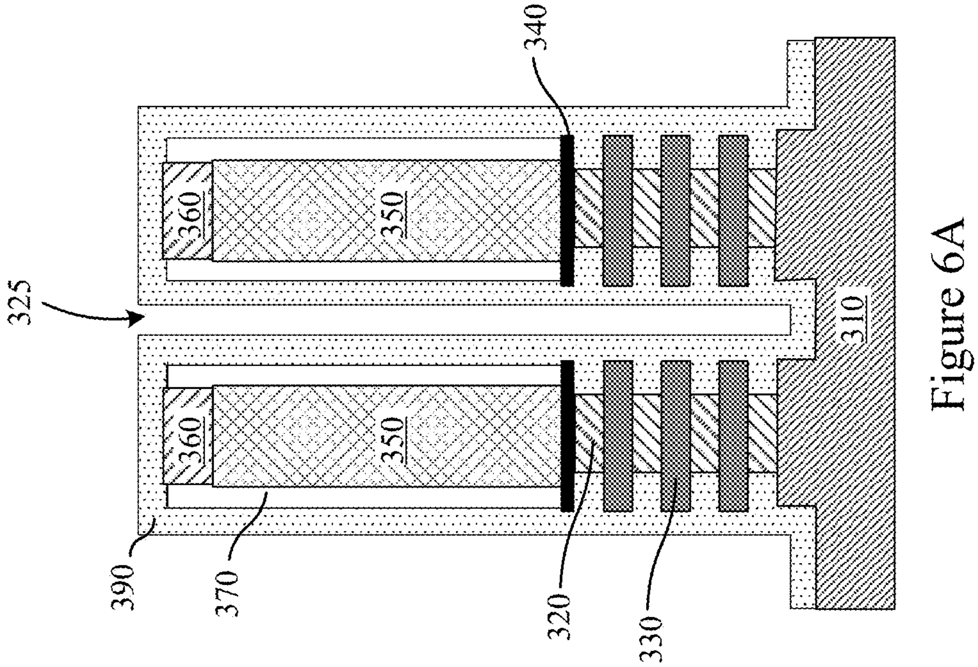

FIGS. 6A and 6B illustrate cross-sectional views of intermediate steps of fabricating gate-all-around field effect transistors (GAAFETs), comprising two dummy gate structures, a hard mask, and an underlying stack of nanosheets and sacrificial layers with two sidewall spacer layers, in accordance with some embodiments.

In various embodiments, a substrate 310 may comprise a plurality of nanosheet layers or nanosheets 330 formed therein. Nanosheets 330 may be spaced apart from each other by one of a plurality of sacrificial layers 320. Thus, substrate 310 comprises alternating layers of sacrificial layers 320 and the nanosheets 330. It should be noted that while three layers of nanosheets 330 are depicted in FIG. 6A, the number of layers is not limited. In various embodiments, nanosheets 330, at the end of fabrication, may form transistor channels, while sacrificial layers 320 will be removed in a later step of fabrication to free up a void space for the formation of a gate stack comprising a gate dielectric and a gate electrode. In some embodiments, nanosheets 330 have a thickness of a few nanometer to tens of nanometer, for example, about 5 nm to about 20 nm in one embodiment. In certain embodiments, sacrificial layers 320 comprise silicon germanium (SiGe) and nanosheets 330 comprise silicon. In alternate embodiments, sacrificial layers 320 comprise silicon and nanosheets 330 comprise silicon germanium.

In certain embodiments, a stack of nanosheets 330 and sacrificial layer 320 may be formed by deposition processes, for example, epitaxially by a CVD method. In various embodiments, each layer of sacrificial layers 320 and nanosheets 330 may be few to several nanometers in thickness. In one embodiment, each layer of sacrificial layers 320 may have a thickness between 5 nm and 20 nm and each layer of nanosheets 330 may have a thickness between 5 nm and 20 nm.

In some embodiments, substrate 310 may further comprise a dielectric blocking layer 340 over the alternating layer stack of nanosheets 330 and sacrificial layers 320. Dielectric blocking layer 340 may be an oxide layer in one embodiment. Dielectric blocking layer 340 may be formed by deposition processes, for example, by a CVD method. Dielectric blocking layer 340 may be used as an etch stop layer and may be optional. Dielectric blocking layer 340 may be also referred to as a dummy gate dielectric.

In some embodiments, substrate 310 may further comprise dummy gates 350 over the stack of nanosheets 330 and sacrificial layer 320. In FIG. 6A, two dummy gates 350 are illustrated as example. In other embodiments, any desired number of dummy gates 350 may be formed. Dummy gate 350 may comprise polysilicon or amorphous silicon, as example. Dummy gate 350 may be deposited using deposition techniques such as CVD, PVD, PECVD, sputtering, a combination thereof, or the like. The material of the dummy gates 350 may be patterned using suitable photolithography and etch processes to form dummy gates 350. Dummy gates 350 may be separated by a recess 325. In various embodiments, dummy gates 350 may have a thickness in a range from about 5 nm to about 500 nm.

Still referring to FIG. 6A, a hard mask 360 used for patterning and forming dummy gates 350 may be present over dummy gates 350. In various embodiments, hard mask 360 may comprise silicon oxide, silicon nitride, silicon carbonitride (SiCN), silicon oxycarbide (SiOC), a combination thereof, or the like.

In some embodiments, a first sidewall spacer layer 370 may be deposited over dummy gates 350 and the alternating layer stack of nanosheets 330 and sacrificial layers 320. In various embodiments, first sidewall spacer layer 370 may comprise a dielectric material comprising an oxide or a nitride. In certain embodiments, first sidewall spacer layer 370 may comprise a silicon-containing dielectric material such as silicon oxide, silicon oxynitride (SiON), silicon oxycarbonitride (SiOCN), silicon boron carbonitride (SiBCN), a combination thereof, or the like. First sidewall spacer layer 370 may be deposited using deposition techniques such as CVD, PVD, PECVD, ALD, sputtering, a combination thereof, or the like. In various embodiments, first sidewall spacer layer 370 may have a thickness in a range from about 1 nm to about 50 nm.

In certain embodiments, a height of dummy gates 350 may be between 200 nm and 250 nm and the distance between the dummy gates 350 may be between 6 nm and 50 nm. This high aspect ratio makes it challenging to lateral etch target materials within recess 325 while preventing any damage to other materials.

Further in FIG. 6A, recess 325 may be extended into the alternating layer stack of nanosheets 330 and sacrificial layers 320 using a suitable etch process while using dummy gates 350 as an etch mask. Subsequently, lateral recesses may be formed between layers of nanosheets 330 using a suitable etch process, for example. Further, a second sidewall spacer layer 390 may be deposited over substrate 310. In this step, the lateral recesses (i.e., the spaces between layers of nanosheets 330) are also filled with the second sidewall spacer layer material.

In certain embodiments, second sidewall spacer layer 390 may comprise silicon-containing dielectric materials such as silicon nitride, silicon carbonitride (SiCN), silicon oxycarbonitride (SiOCN), silicon boron carbonitride (SiBCN), a combination thereof, or the like. The formation of second sidewall spacer layer 390 may be performed by a deposition method such as CVD, PECVD, low-pressure CVD (LPCVD), PVD, ALD, a combination thereof, or the like. For a plasma deposition process, a precursor gas mixture can be used including but not limited to silanes, hydrocarbons, fluorocarbons, or nitrogen containing compounds in combination with one or more dilution gases (e.g., argon, nitrogen, etc.) at a variety of pressure, power, flow and temperature conditions. Second sidewall spacer layer 390 is the layer to be laterally etched with selective bottom protection and may correspond to dielectric layer 208 illustrated in FIGS. 2A-5A and 2B-5B.

FIG. 6B illustrates a cross-sectional view of substrate 310 after performing a lateral etch with selective bottom protection. The details of the selective bottom protection and the lateral etch may be the same as previously described in FIGS. 2A-5A and 2B-5B, and thus will not be repeated.

In various embodiments, a second sidewall spacer etch back may be performed to laterally remove only a portion of second sidewall spacer layer 390 and expose tips of nanosheets 330. However, the aspect ratio of recess 325 and the difficultly of lateral etch in general makes it challenging to avoid damaging a bottom portion of recess 325. Accordingly, the methods of selective bottom protection may be applied to protect the substrate 310 and any structures in this region. A protection layer 380 may be formed as described previously and may advantageously protect the bottom of recess 325 during the second sidewall spacer etch back process as indicated by a dashed circle in FIG. 6B.

In various embodiments, the second sidewall spacer etch back process may comprises one or more wet etch processes, plasma etch processes, reactive ion etch (RIE) processes, combinations of these, or other etch processes. After the second sidewall spacer etch back process, some portions of second sidewall spacer layer 390 are left between the layers of nanosheets 330. The remaining portions of second sidewall spacer layer 390 ensures the electrical insulation between gate stacks and source/drain regions that will be formed at later fabrication steps.

Figure 7:
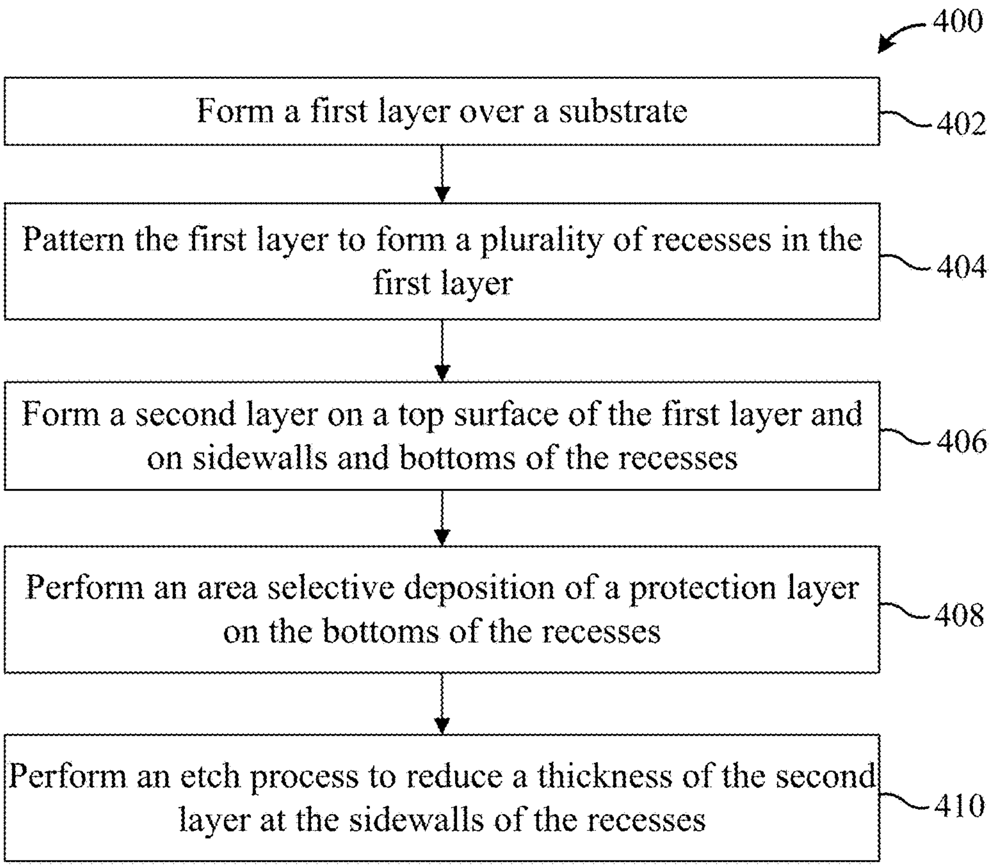
FIG. 7 illustrates a process flow chart diagram of a method for a lateral etch with selective bottom protection, in accordance with some embodiments.

FIG. 7 illustrates a process flow chart diagram of a method 400 for manufacturing a semiconductor structure, in accordance with some embodiments. Method 400 will be described in conjunction with FIGS. 1A-1D, 2A, 2B, 3A, 3B, 4A, 4B, 5A, and 5B. In step 402, a first layer (e.g., material layer 204) is formed over a substrate (e.g., substrate 202) as described above with reference to FIGS. 2A and 2B. In step 404, the first layer (e.g., material layer 204) is patterned to form a plurality of recesses (e.g., recesses 206) in the first layer (e.g., material layer 204) as described above with reference to FIGS. 2A and 2B. In step 406, a second layer (e.g., dielectric layer 208) is formed on a top surface of the first layer (e.g., material layer 204) and on sidewalls and bottoms of the recesses (e.g., recesses 206) as described above with reference to FIGS. 3A and 3B. In step 408, an area selective deposition of a protection layer (e.g., protection layer 210A) is performed on the bottoms of the recesses (e.g., recesses 206) as described above with reference to FIGS. 4A and 4B. In certain embodiments, the area selective deposition process may be performed according to a method 500 described below with reference to FIG. 8. In step 410, an etch process is performed to reduce a thickness of the second layer (e.g., dielectric layer 208) at the sidewalls of the recesses (e.g., recesses 206) as described above with reference to FIGS. 5A and 5B. The etch process may be also referred to as a lateral etch process. In one embodiment, all of steps 402-410 are performed in a same plasma processing chamber (e.g., plasma processing chamber 108; see above, FIGS. 1A-1D) of a plasma processing system (e.g., plasma processing system 100A, 100B, 100C, or 100D; see above, FIGS. 1A-1D). In other embodiments, each or some of steps 402-410 may be performed in different processing chambers. In certain embodiments, after performing step 410, steps 408 and 410 may be repeated one or more times in a cyclical manner.

Figure 8:
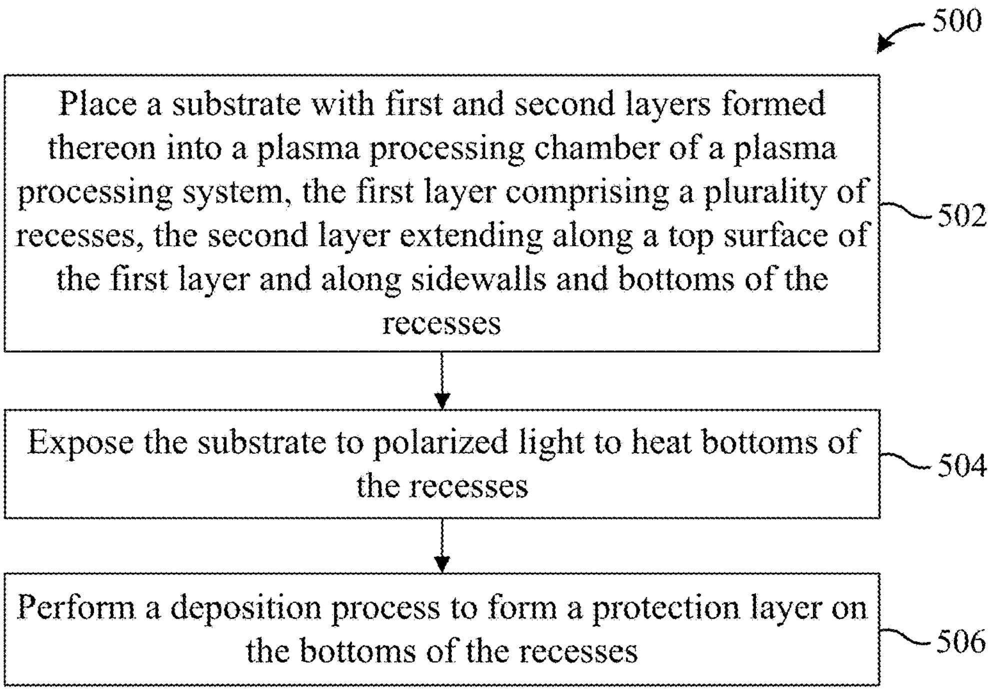
FIG. 8 illustrates a process flow chart diagram of a method for performing an area selective deposition process, in accordance with some embodiments.

FIG. 8 illustrates a process flow chart diagram of a method 500 for performing an area selective deposition process, in accordance with some embodiments. Method 500 will be described in conjunction with FIGS. 1A-1D, 4A, and 4B. In step 502, a substrate (e.g., substrate 202) is placed in a plasma processing chamber (e.g., plasma processing chamber 108; see above, FIGS. 1A-1D) of a plasma processing system (e.g., plasma processing system 100A, 100B, 100C, or 100D; see above, FIGS. 1A-1D) as described above with reference to FIGS. 4A and 4B. In some embodiments, the substrate (e.g., substrate 202) may comprise a first layer (e.g., material layer 204) and a second layer (e.g., dielectric layer 208) formed thereon such that the first layer (e.g., material layer 204) comprises a plurality of recesses (e.g., recesses 206) and the second layer (e.g., dielectric layer 208) extends along a top surface of the first layer (e.g., material layer 204) and along sidewalls and bottoms of the recesses (e.g., recesses 206) as described above with reference to FIGS. 4A and 4B. In step 504, the substrate (e.g., substrate 202) is exposed to polarized light (e.g., polarized light 132) to heat bottoms of the recesses (e.g., recesses 206) as described above with reference to FIGS. 4A and 4B. In step 506, a deposition process is performed to form a protection layer (e.g., protection layer 210A) on the bottoms of the recesses (e.g., recesses 206) as described above with reference to FIGS. 4A and 4B. In certain embodiments, steps 504 and 506 may be performed concurrently.

Example embodiments of the disclosure are described below. Other embodiments can also be understood from the entirety of the specification as well as the claims filed herein.

Example 1. A method including forming a first layer over a substrate, patterning the first layer to form a plurality of recesses therein, forming a second layer on a top surface of the first layer and on sidewalls and bottoms of the recesses, selectively forming a protection layer on the bottoms of the recesses. Selectively forming the protection layer includes heating bottoms of the recesses with polarized light and depositing a material of the protection layer on the bottoms of the recesses. The method further includes performing a lateral etch process to reduce a thickness of the second layer at the sidewalls of the recesses.

Example 2. The method of example 1, where the polarized light is linearly polarized.

Example 3. The method of one of examples 1 and 2, where the polarized light is circularly polarized.

Example 4. The method of one of examples 1 to 3, where depositing the material of the protection layer includes performing a plasma-assisted deposition process.

Example 5. The method of one of examples 1 to 3, where depositing the material of the protection layer includes performing a plasma-free deposition process.

Example 6. The method of one of examples 1 to 5, where the lateral etch process is a plasma etch process.

Example 7. The method of one of examples 1 to 6, where a temperature of the top surface of the first layer is lower than a temperature of the bottoms of the recesses after heating the bottoms of the recesses with the polarized light.

Example 8. A method including introducing a substrate into a processing chamber, the substrate including a plurality of recesses and a dielectric layer lining bottoms and sidewalls of the recesses, and while the substrate is in the processing chamber, performing an area selective deposition process to form a protection layer on the dielectric layer at the bottoms of the recesses. Performing the area selective deposition process includes exposing the substrate to polarized light, the polarized light heating the dielectric layer at the bottoms of the recesses, and performing a deposition process on the substrate to form a material of the protection layer over the dielectric layer at the bottoms of the recesses. A width of the recesses is less than half a wavelength of the polarized light. The method further includes performing a lateral etch process on the substrate to reduce a thickness of the dielectric layer at the sidewalls of the recesses.

Example 9. The method of example 8, where the lateral etch process is performed in the processing chamber.

Example 10. The method of one of examples 8 and 9, where the polarized light enters the processing chamber through a top surface of the processing chamber.

Example 11. The method of one of examples 8 to 10, where the polarized light enters the processing chamber through a sidewall of the processing chamber.

Example 12. The method of one of examples 8 to 10, further including repeating the area selective deposition process and the lateral etch process one or more times.

Example 13. The method of one of examples 8 to 12, where the processing chamber is part of an inductively coupled plasma processing system.

Example 14. The method of one of examples 8 to 13, where the processing chamber is part of a capacitively coupled plasma processing system.

Example 15. A method including placing a substrate on a holder within a plasma processing chamber, the substrate including a plurality of recesses and a dielectric layer lining bottoms and sidewalls of the recesses. The method further includes, while the substrate is on the holder, performing an area selective deposition process to form a protection layer on the dielectric layer at the bottoms of the recesses. Performing the area selective deposition process includes exposing the substrate to polarized light, the polarized light heating the dielectric layer at the bottoms of the recesses, and performing a plasma-assisted deposition process on the substrate to form a material of the protection layer on the dielectric layer at the bottoms of the recesses. The method further includes performing a plasma-assisted lateral etch process on the substrate to reduce a thickness of the dielectric layer at the sidewalls of the recesses. The protection layer covers the dielectric layer at the bottoms of the recesses while performing the plasma-assisted lateral etch process.

Example 16. The method of example 15, where the plasma-assisted lateral etch process removes a portion of the protection layer.

Example 17. The method of one of examples 15 and 16, where exposing the substrate to the polarized light and performing the plasma-assisted deposition process on the substrate are performed concurrently.

Example 18. The method of one of examples 15 to 17, further including repeating the area selective deposition process and the plasma-assisted lateral etch process one or more times.

Example 19. The method of one of examples 15 to 18, where the plasma-assisted lateral etch process etches the dielectric layer faster than the protection layer.

Example 20. The method of one of examples 15 to 19, where a width of the recesses is less than half a wavelength of the polarized light.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

"Substrate," "target substrate," "structure," or "device" as used herein generically refers to an object being processed in accordance with the disclosure, and may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate, structure, or device is not limited to any particular base structure, underlying layer or overlying layer, patterned or un-patterned, but rather, is contemplated to include any such layer or base structure, and any combination of layers and/or base structures. The description may reference particular types of substrates, structures, or devices, but this is for illustrative purposes only.

Although this disclosure describes particular process steps as occurring in a particular order, this disclosure contemplates the process steps occurring in any suitable order. While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method comprising:
- forming a first layer over a substrate;
- patterning the first layer to form a plurality of recesses therein;
- forming a second layer on a top surface of the first layer and on sidewalls and bottoms of the recesses;
- selectively forming a protection layer on the bottoms of the recesses, wherein selectively forming the protection layer comprises:
  - heating the bottoms of the recesses with polarized light; and
  - depositing a material of the protection layer on the bottoms of the recesses; and
- performing a lateral etch process to reduce a thickness of the second layer at the sidewalls of the recesses.

2. The method of claim 1, wherein the polarized light is linearly polarized.

3. The method of claim 1, wherein the polarized light is circularly polarized.

4. The method of claim 1, wherein depositing the material of the protection layer comprises performing a plasma-assisted deposition process.

5. The method of claim 1, wherein depositing the material of the protection layer comprises performing a plasma-free deposition process.

6. The method of claim 1, wherein the lateral etch process is a plasma etch process.

7. The method of claim 1, wherein a temperature of the top surface of the first layer is lower than a temperature of the bottoms of the recesses after heating the bottoms of the recesses with the polarized light.

8. A method comprising:
- introducing a substrate into a processing chamber, the substrate comprising a plurality of recesses and a dielectric layer lining bottoms and sidewalls of the recesses;
- while the substrate is in the processing chamber, performing an area selective deposition process to form a protection layer on the dielectric layer at the bottoms of the recesses, wherein performing the area selective deposition process comprises:
  - exposing the substrate to polarized light, the polarized light heating the dielectric layer at the bottoms of the recesses, wherein a width of the recesses is less than half a wavelength of the polarized light; and
  - performing a deposition process on the substrate to form a material of the protection layer over the dielectric layer at the bottoms of the recesses; and
- performing a lateral etch process on the substrate to reduce a thickness of the dielectric layer at the sidewalls of the recesses.

9. The method of claim 8, wherein the lateral etch process is performed in the processing chamber.

10. The method of claim 8, wherein the polarized light enters the processing chamber through a top surface of the processing chamber.

11. The method of claim 8, wherein the polarized light enters the processing chamber through a sidewall of the processing chamber.

12. The method of claim 8, further comprising repeating the area selective deposition process and the lateral etch process one or more times.

13. The method of claim 8, wherein the processing chamber is part of an inductively coupled plasma processing system.

14. The method of claim 8, wherein the processing chamber is part of a capacitively coupled plasma processing system.

15. A method comprising:
- placing a substrate on a holder within a plasma processing chamber, the substrate comprising a plurality of recesses and a dielectric layer lining bottoms and sidewalls of the recesses; and
- while the substrate is on the holder:
  - performing an area selective deposition process to form a protection layer on the dielectric layer at the bottoms of the recesses, wherein performing the area selective deposition process comprises:
    - exposing the substrate to polarized light, the polarized light heating the dielectric layer at the bottoms of the recesses; and
    - performing a plasma-assisted deposition process on the substrate to form a material of the protection layer on the dielectric layer at the bottoms of the recesses; and
  - performing a plasma-assisted lateral etch process on the substrate to reduce a thickness of the dielectric layer at the sidewalls of the recesses, wherein the protection layer covers the dielectric layer at the bottoms of the recesses while performing the plasma-assisted lateral etch process.

16. The method of claim 15, wherein the plasma-assisted lateral etch process removes a portion of the protection layer.

17. The method of claim 15, wherein exposing the substrate to the polarized light and performing the plasma-assisted deposition process on the substrate are performed concurrently.

18. The method of claim 15, further comprising repeating the area selective deposition process and the plasma-assisted lateral etch process one or more times.

19. The method of claim 15, wherein the plasma-assisted lateral etch process etches the dielectric layer faster than the protection layer.

20. The method of claim 15, wherein a width of the recesses is less than half a wavelength of the polarized light.

* * * * *